United States Patent
Quick et al.

(10) Patent No.: US 7,811,914 B1
(45) Date of Patent: Oct. 12, 2010

(54) APPARATUS AND METHOD FOR INCREASING THERMAL CONDUCTIVITY OF A SUBSTRATE

(76) Inventors: Nathaniel R. Quick, 894 Silverado Ct., Lake Mary, FL (US) 32746; Aravinda Kar, 745 S. Lake Claire Cir., Oviedo, FL (US) 32765

( * ) Notice: Subject to any disclaimer, the term of this patent is extended or adjusted under 35 U.S.C. 154(b) by 488 days.

(21) Appl. No.: 11/407,738

(22) Filed: Apr. 20, 2006

(51) Int. Cl.
*H01L 21/26* (2006.01)

(52) U.S. Cl. .............................. 438/535; 257/E21.333

(58) Field of Classification Search ................. 438/105, 438/518, 535, 931, 932; 257/E21.333, E21, 257/475
See application file for complete search history.

(56) References Cited

U.S. PATENT DOCUMENTS

| | | | |
|---|---|---|---|
| 3,214,315 A | 10/1965 | Hildebrand | |
| 3,396,401 A | 8/1968 | Nonomura | |
| 3,419,321 A | 12/1968 | Barber et al. | |
| 3,605,469 A | 9/1971 | Queralto | |
| 3,788,120 A | 1/1974 | Takeo et al. | |
| 3,854,123 A | 12/1974 | Banach | |
| 3,865,564 A | 2/1975 | Jaeger et al. | |
| 3,874,240 A | 4/1975 | Rembaum | |
| 3,943,324 A | 3/1976 | Haggerty | |
| 3,944,640 A | 3/1976 | Haggerty et al. | |
| 3,945,318 A | 3/1976 | Landsman | |
| 3,965,328 A | 6/1976 | Locke | |
| 3,981,705 A | 9/1976 | Jaeger et al. | |
| 4,043,170 A | 8/1977 | Erodi et al. | |
| 4,135,902 A | 1/1979 | Oehrle | |
| 4,142,088 A | 2/1979 | Hirsch | |
| 4,159,414 A | 6/1979 | Suh et al. | |
| 4,215,263 A | 7/1980 | Grey et al. | |
| 4,309,224 A | 1/1982 | Shibata | |

(Continued)

FOREIGN PATENT DOCUMENTS

JP     358095830 A     6/1983

(Continued)

OTHER PUBLICATIONS

I.A. Salama, N. R. Quick and A. Kar, Microstructural and electrical resistance analysis of laser-processed SiC substrates for wide bandgap semiconductor materials, Journal of Materials Science, vol. 40, 2005, pp. 3969-3980.

(Continued)

*Primary Examiner*—Chandra Chaudhari
(74) *Attorney, Agent, or Firm*—Frijouf, Rust & Pyle P.A.

(57) ABSTRACT

An apparatus and method is disclosed for increasing the thermal conductivity in a substrate of a non-wide bandgap material comprising the steps of directing a thermal energy beam onto the substrate in the presence of a first doping gas for converting a region of the substrate into a wide bandgap material to enhance the thermal conductivity of the substrate for cooling the non-wide bandgap material. In one example, the invention is incorporated into a carbon rich layer formed within the wide bandgap material. In another example, the invention is incorporated into a carbon rich layer formed within the wide bandgap material having basal planes disposed to extend generally outwardly relative to an external surface of the substrate to enhance the cooling of the substrate.

14 Claims, 9 Drawing Sheets

U.S. PATENT DOCUMENTS

| | | | |
|---|---|---|---|
| 4,339,285 | A | 7/1982 | Pankove |
| 4,372,989 | A | 2/1983 | Menzel |
| 4,383,843 | A | 5/1983 | Iyengar |
| 4,496,607 | A | 1/1985 | Mathias |
| 4,539,251 | A | 9/1985 | Sugisawa et al. |
| 4,547,650 | A | 10/1985 | Arditty et al. |
| 4,565,712 | A | 1/1986 | Noguchi et al. |
| 4,620,264 | A | 10/1986 | Ushifusa et al. |
| 4,624,934 | A | 11/1986 | Kokubu et al. |
| 4,663,826 | A | 5/1987 | Baeuerle |
| 4,691,091 | A | 9/1987 | Lyons et al. |
| 4,710,253 | A | 12/1987 | Soszek |
| 4,761,339 | A | 8/1988 | Komatsu et al. |
| 4,791,239 | A | 12/1988 | Sirahata et al. |
| 4,840,853 | A | 6/1989 | Lio et al. |
| 4,847,138 | A | 7/1989 | Boylan et al. |
| 4,860,442 | A | 8/1989 | Ainsworth et al. |
| 4,872,923 | A | 10/1989 | Borodin |
| 4,880,770 | A | 11/1989 | Mir et al. |
| 4,901,550 | A | 2/1990 | Kolde |
| 4,912,087 | A | 3/1990 | Aslam et al. |
| 4,924,033 | A | 5/1990 | Iyogi et al. |
| 4,950,558 | A | 8/1990 | Sarin |
| 4,962,085 | A | 10/1990 | deBarbadillo, II et al. |
| 4,988,564 | A | 1/1991 | D'Angelo et al. |
| 5,015,618 | A | 5/1991 | Levinson |
| 5,055,967 | A | 10/1991 | Sukonnik et al. |
| 5,127,364 | A | 7/1992 | Savkar et al. |
| 5,145,741 | A | 9/1992 | Quick |
| 5,149,681 | A | 9/1992 | Ohkawa et al. |
| 5,180,440 | A | 1/1993 | Siegel et al. |
| 5,336,360 | A | 8/1994 | Nordine |
| 5,391,841 | A | 2/1995 | Quick |
| 5,405,481 | A | 4/1995 | Licoppe et al. |
| 5,459,098 | A | 10/1995 | Maya |
| 5,493,096 | A | 2/1996 | Koh |
| 5,549,971 | A | 8/1996 | Nordine |
| 5,629,532 | A | 5/1997 | Myrick |
| 5,680,200 | A | 10/1997 | Sugaya et al. |
| 5,695,828 | A | 12/1997 | Ghosh et al. |
| 5,733,609 | A | 3/1998 | Wang |
| 5,754,299 | A | 5/1998 | Sugaya et al. |
| 5,793,042 | A | 8/1998 | Quick |
| 5,823,039 | A | 10/1998 | Umeda et al. |
| 5,837,607 | A | 11/1998 | Quick |
| 5,847,418 | A | 12/1998 | Nakamura et al. |
| 5,889,234 | A | 3/1999 | Ghosh et al. |
| 5,906,708 | A | 5/1999 | Robinson et al. |
| 5,961,877 | A | 10/1999 | Robinson et al. |
| 6,025,609 | A | 2/2000 | Quick |
| 6,054,375 | A | 4/2000 | Quick |
| 6,064,081 | A | 5/2000 | Robinson et al. |
| 6,203,861 | B1 | 3/2001 | Kar et al. |
| 6,221,154 | B1 | 4/2001 | Lee et al. |
| 6,252,197 | B1 | 6/2001 | Hoekstra et al. |
| 6,255,671 | B1 | 7/2001 | Bojarczuk et al. |
| 6,271,576 | B1 | 8/2001 | Quick |
| 6,274,234 | B1 | 8/2001 | Dujardin et al. |
| 6,313,015 | B1 | 11/2001 | Lee et al. |
| 6,334,939 | B1 | 1/2002 | Zhou et al. |
| 6,407,443 | B2 | 6/2002 | Chen et al. |
| 6,526,327 | B2 | 2/2003 | Kar et al. |
| 6,621,448 | B1 | 9/2003 | Lasky et al. |
| 6,670,693 | B1 | 12/2003 | Quick |
| 6,732,562 | B2 | 5/2004 | Quick et al. |
| 6,930,009 | B1 | 8/2005 | Quick |
| 6,939,748 | B1 | 9/2005 | Quick |
| 7,237,422 | B2 | 7/2007 | Quick |
| 7,268,063 | B1 | 9/2007 | Quick |
| 7,419,887 | B1 | 9/2008 | Quick |
| 2002/0019117 | A1* | 2/2002 | Nagasawa .................. 438/505 |

FOREIGN PATENT DOCUMENTS

| | | |
|---|---|---|
| JP | 405024975 A | 2/1993 |
| WO | WO 03013757 | 2/2003 |

OTHER PUBLICATIONS

Z. Tian, N. R. Quick and A. Kar; Characteristics of 6H-Silicon Carbide PIN Diodes Prototyping by Laser Doping, Journal of Electronic Materials, vol. 34, 2005, pp. 430-438.

Chong Zhang, A. Salama, N. R. Quick and A. Kar, Two-Dimensional Transient Modeling of CO2 Laser Drilling of Microvias in High Density Flip Chip Substrates, ICALEO 2005 (International Congress On Applications of Lasers and Electro-Optics), Laser Institute of America, Oct. 31-Nov. 3, 2005.

Chong Zhang, S. Bet, A. Salama, N. R. Quick and A. Kar, CO2 Laser Drilling of Microvias Using Diffractive Optics Techniques: I Mathematical Modeling, InterPack 05, The ASME/Pacific Rim Technical Conference on Integration and Packaging of MEMS, NEMS and Electronic Systems, San Francisco, CA Jul. 17-22, 2005.

Z. Tian, N. R. Quick and A. Kar, Laser Synthesis of Optical Structures in Silicon Carbide, 207th Meeting of the Electrochemical Society Proceedings, May 15-20, 2005.

Z. Tian, N.R. Quick and A. Kar, Laser-enhanced diffusion of nitrogen and aluminum dopants in silicon carbide, Acta Materiallia, vol. 54, 2006, pp. 4273-4283.

Z. Tian, N.R. Quick and A. Kar,Laser Direct Write Doping and Metallization Fabrication of Silicon Carbide PIN Diodes, Materials Science Forum, vols. 527-529, 2006, pp. 823-826.

S. Dakshinamurthy, N.R. Quick and A. Kar, SiC-based Optical Interferometry at high pressures and temperatures for pressure and chemical sensing, Journal of Applied Physics, vol. 99, 2006, pp. 094902-1 to 094902-8.

C. Zhang, A. Salama, N. R. Quick and A. Kar, Modelling of Microvia Drilling with a Nd:YAG Laser, Journal of Physics D: Applied Physics 39 (2006) 3910-3918.

Z. Tian, N. R. Quick and A. Kar, Laser Endotaxy and PIN Diode Fabrication of Silicon Carbide, 2006 Spring Meting of Materials Research Society, 2006.

Z. Tian, N. R. Quick and A. Kar, Characteristics of Laser-Fabricated Diodes on Endotaxial Silicon Carbide Substrates, ESCRM (European Conference on Silicon Carbide and Related Materials) Proceedings 2006.

S. Bet, N.R. Quick and A. Kar, Laser Doping of Chromium and Selenium in p-type 4H-SiC, ICSCRM 2007 Symposium.

N. Quick, S. Bet and A. Kar, Laser Doping Fabrication of Energy Conversion Devices Materials Science and Technology 2007 Conference and Exhibition.

S. Bet, N.R. Quick and A. Kar, Effect of Laser Field and Thermal Stress on Diffusion in Laser Doping of SiC, Acta Materialia 55 (2007) 6816-6824.

S. Bet, N.R. Quick and A. Kar, Laser-Doping of Silicon Carbide for p-n Junction and LED Fabrication, Physica Status Solidi (A), vol. 204, No. 4, 2007, pp. 1147-1157.

S. Dakshinamurthy, N.R. Quick and A. Kar, Temperature-dependent Optical Properties of Silicon Carbide for Wireless Temperature Sensors, Journal of PhysicsD: Applied Physics 40 (2007)353-360.

S. Dakshinamurthy, N.R. Quick and A. Kar, High temperature optical properties of silicon carbide for wireless thermal sensing, Journal of Physics D: Applied Physics, vol. 40, No. 2, 2007, pp. 353-360.

Chong Zhang, A. Salama, N. R. Quick and A. Kar, Determination of Thermophysical Properties for Polymer Films using Conduction Analysis of Laser Heating, International Journal of Thermophysics, vol. 28, No. 3, Jun. 2007.

N. R. Quick, S. Bet and A. Kar, Laser Doping Fabrication of Energy Conversion Devices, Materials Science and Technology 2007 Conference and Exhibition, Sep. 19, 2007.

S. Bet, N.R. Quick and A. Kar, Laser Doping of Chromium in 6H-SiC for White Light Emitting Diodes, Laser Institute of America, Journal Of Laser Applications Vo. 20 No. 1 pp. 43-49 Feb. 2008.

Z. Tian, N. R. Quick and A. Kar, Laser Endotaxy in Silicon Carbide and PIN Diode Fabrication, Laser Institute of America, Journal of Laser Applications, vol. 20 No. 2 pp. 106-115, May 2008.

I. Salama, N. Quick and A. Kar, Laser Direct Write Doping of Wide-Bandgap Semiconductor Materials, ISCS 2003 Proceedings, 2003.

I. Salama, N. Quick and A. Kar, Laser Microprocessing of Wide Bandgap Materials, Proceedings of International Congress on Laser Advanced Materials Processing (LAMP 2002).

* cited by examiner

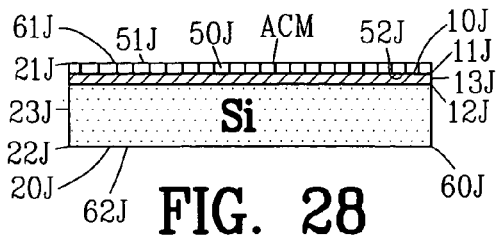
FIG. 28
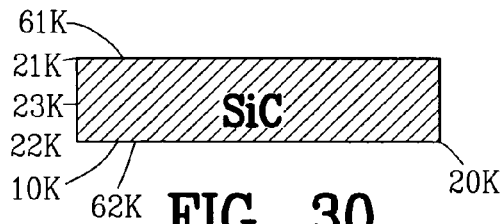
FIG. 30
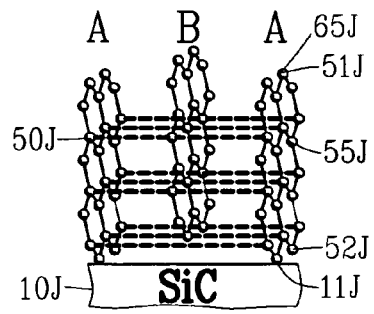
FIG. 29
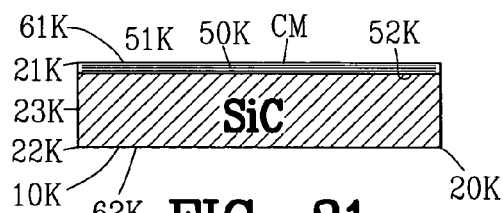
FIG. 31
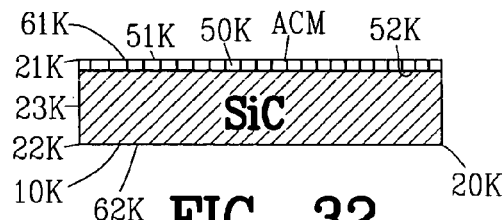
FIG. 32
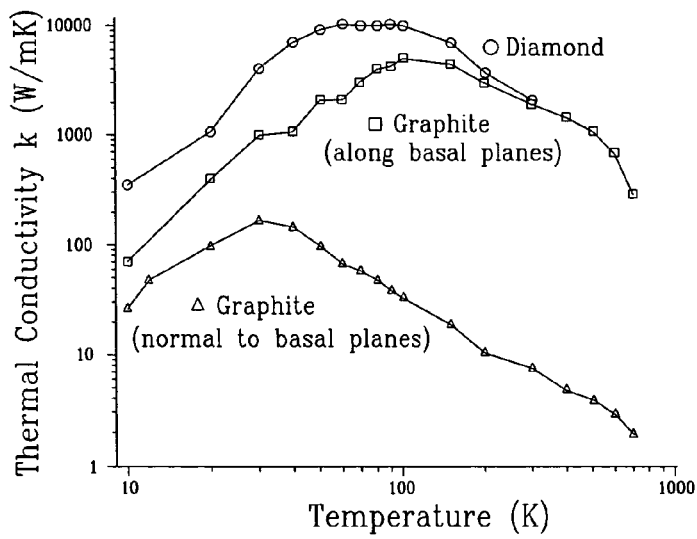
FIG. 33
| Substance | K (w/mK) at 300 K |
|---|---|
| SiC | 490 |
| Ag | 429 |
| Cu | 401 |
| Au | 317 |
| BeO | 260 |
| Al | 237 |
| AlN | 180 |
| Si | 150 |
| $Al_2O_3$ | 40 |
FIG. 34

APPARATUS AND METHOD FOR INCREASING THERMAL CONDUCTIVITY OF A SUBSTRATE

BACKGROUND OF THE INVENTION

1. Field of the Invention

This invention relates to heat transfer and heat dissipation and more particularly to an apparatus and method for increasing the thermal conductivity in a non-wide bandgap and/or wide bandgap substrate for cooling the substrate.

2. Background of the Invention

Presently, silicon and gallium arsenide are the dominant conventional semiconductor materials used in the manufacture of semiconductor devices. Silicon and gallium arsenide are considered non-wide bandgap semiconductors. In contrast, wide bandgap semiconductors have superior properties including breakdown field, dielectric constant, thermal conductivity and saturated electron drift velocity. Unfortunately, wide bandgap semiconductors are expensive due to high processing costs and poor yields emanating from wafer growth through device packaging.

Ceramic substrates having wide bandgap semiconductor compositions, such as silicon carbide (SiC) and aluminum nitride (AlN), are known to exhibit electrical properties ranging from insulating electrical properties, semiconducting electrical properties and conducting electrical properties.

The wide-bandgap semiconductor phases of ceramics and other wide-bandgap semiconductors including diamond are used to create devices such as conductive tabs, interconnects, vias, wiring patterns, resistors, capacitors, semiconductor devices and the like electronic components by laser synthesis on the surfaces and within the body of such wide-bandgap semiconductors to thereby eliminate photolithography processes which require numerous steps and generate undesirable chemical pollutants when processing such traditional electronic devices, components and circuitry.

It is well known that alumina ($Al_2O_3$) dominates the dielectric market as an integrating substrate or device carrier in electronics packaging. Boron nitride (BN), aluminum nitride (AlN), silicon carbide (SiC) and diamond are also of interest due to the thermal coefficient of expansion (TCE) and for the dielectric constant and higher thermal conductivity than that of aluminum oxide ($Al_2O_3$). Silicon carbide (SiC), aluminum nitride (AlN), boron nitride (BN), gallium nitride (GaN) and diamond also exhibit a wide-band gap and chemical resistance as well as exhibiting properties from a semiconductor to an insulator. These properties are of substantial interest for high temperature applications approaching 1000° C. and for aggressive environment applications. In addition, these properties are desirable for high density integrated circuit packing.

In the prior art, metallization methods, including dry-film imaging and screen printing have been used for the production of conductive patterns on alumina. However, metal compatibility difficulties with high thermal conductivity ceramic materials such as aluminum nitride (AlN) and silicon carbide (SiC), have not been completely solved. Copper and silver paste exhibits a thermal coefficient of expansion (TCE) mismatch aggravated by high temperatures as well as being subject to oxidation that increases the resistivity. In particular, bonding of copper to aluminum nitride (AlN) has proved to be nontrivial. Alumina or stoichiometric aluminum oxynitride (AlON) coatings must be developed on the aluminum nitride (AlN) surface through passivation processes. These passivation processes have poor reproducibility. Thus, the direct laser synthesis of conductors in aluminum nitride (AlN), silicon carbide (SiC) and diamond substrates appears to provide solutions to this long standing prior art problem with regard to metallization and for more simple processing techniques for creating devices and circuitry that are compatible with selected ceramic substrates, while satisfying the need for higher temperature, aggressive environment, and higher density integrated circuit packaging applications.

Discussion of wide bandgap materials and the processing thereof are discussed in U.S. Pat. No. 5,145,741; U.S. Pat. No. 5,391,841; U.S. Pat. No. 5,793,042; U.S. Pat. No. 5,837,607; U.S. Pat. No. 6,025,609; U.S. Pat. No. 6,054,375; U.S. Pat. No. 6,271,576, U.S. Pat. No. 6,670,693, U.S. Pat. No. 6,930,009 and U.S. Pat. No. 6,939,748 are hereby incorporated by reference into the present application.

Therefore, it is an object of this invention to provide a process for forming a wide bandgap material within a non-wide bandgap substrate to enhance the thermal conductivity and heat dissipation of the substrate.

Another object of this invention is to provide a process for forming a thermal conducting material within a wide bandgap material to enhance the thermal conductivity and heat dissipation thereof.

Another object of this invention is to provide a non-wide bandgap substrate with a wide bandgap material formed therein for enhancing the thermal conductivity and heat dissipation of the substrate.

Another object of this invention is to provide a wide bandgap substrate with a thermal conducting material formed therein for enhancing the thermal conductivity and heat dissipation of the substrate.

Another object of this invention is to provide a thermal interface material that forms a continuous or diffuse boundary as opposed to a discrete boundary and matches the coefficient of thermal expansion of the parent substrate.

Another object of this invention is to provide a process that does not introduce defects into the parent substrate nor the thermal interface material.

The foregoing has outlined some of the more pertinent objects of the present invention. These objects should be construed as being merely illustrative of some of the more prominent features and applications of the invention. Many other beneficial results can be obtained by modifying the invention within the scope of the invention. Accordingly other objects in a full understanding of the invention may be had by referring to the summary of the invention, the detailed description describing the preferred embodiment in addition to the scope of the invention defined by the claims taken in conjunction with the accompanying drawings.

SUMMARY OF THE INVENTION

The present invention is defined by the appended claims with specific embodiments being shown in the attached drawings. For the purpose of summarizing the invention, the invention relates to the process of increasing the thermal conductivity in a substrate of a non-wide bandgap material comprising the steps of providing a substrate of a non-wide bandgap material having a first and a second region. A first doping gas is applied to the first region of the substrate. A first thermal energy beam is directed onto the first region of the substrate in the presence of the first doping gas for converting the first region of the substrate into a wide bandgap material to enhance the thermal conductivity between the first and the second regions of the substrate for cooling the non-wide bandgap material.

In an alternate arrangement of this invention, a first thermal energy beam is directed onto the first region of the substrate in the presence of the first doping gas for converting the first region of the substrate into a wide bandgap material. A second doping gas is applied to the wide bandgap material. A second thermal energy beam is directed onto the wide bandgap material in the presence of the second doping gas for converting a portion of the wide bandgap material into a thermal conducting material to enhance the thermal conductivity between the first and the second regions of the substrate for cooling the non-wide bandgap material.

In an alternate arrangement of this invention, a first thermal energy beam is directed onto the first region of the substrate in the presence of the first doping gas for converting the first region of the substrate into a wide bandgap material. A second thermal energy beam is directed onto the wide bandgap material for converting a portion of the wide bandgap material into a thermal conducting material to enhance the thermal conductivity between the first and the second regions of the substrate for cooling the non-wide bandgap material.

In an alternate arrangement of this invention, a first thermal energy beam is directed onto the first region of the substrate in the presence of the first doping gas for converting the first region of the substrate into a wide bandgap material. A second thermal energy beam is directed onto the wide bandgap material simultaneously converting a portion of the wide bandgap material into a thermal conducting material and orienting the crystal lattice to enhance the thermal conductivity between the first and the second regions of the substrate for cooling the non-wide bandgap material.

In another alternate arrangement of the invention, a second thermal energy beam is directed onto the wide bandgap material in the presence of the second doping gas for converting a portion of the wide bandgap material into a thermal conducting material having an atomic structure defining basal planes. A third thermal energy beam is focused inside the thermal conducting material for aligning the basal planes of the atomic structure of the thermal conducting material to extend generally outwardly relative to an external surface of the substrate to enhance the thermal conductivity between the first and the second regions of the substrate for cooling the non-wide bandgap material.

In another embodiment of the invention, the invention is incorporated into the process of increasing the thermal conductivity in a silicon substrate comprising the steps of providing a substrate of a silicon material having a first and a second region. A first carbon donating doping gas is applied to the first region of the silicon substrate. A first thermal energy beam is directed onto the first region of the silicon substrate in the presence of the first carbon donating doping gas for converting the first region of the silicon substrate into silicon carbide to enhance the thermal conductivity between the first and the second regions of the substrate for cooling the silicon substrate.

In an alternate arrangement of this invention, a second reacting gas of carbon monoxide or carbon dioxide is applied to the silicon carbide. A second laser energy beam is directed onto the silicon carbide in the presence of a carbon monoxide-carbon dioxide gas mixture to diffuse silicon to the surface and react the silicon with carbon dioxide to form silicon oxide gas thereby creating a layer of silicon carbide having lattice vacancies. A third carbon donating doping gas is applied to the layer of silicon carbide having lattice vacancies. A third thermal energy beam is directed onto the layer of silicon carbide having lattice vacancies in the presence of third carbon donating doping gas to diffuse carbon into the lattice vacancies to create a carbon rich layer to enhance the thermal conductivity between the first and the second regions of the substrate for cooling the silicon substrate.

In another alternate arrangement of the invention, a second laser energy beam is directed onto the silicon carbide in the presence of a carbon monoxide-carbon dioxide gas mixture to diffuse silicon to the surface and react the silicon with carbon dioxide to form silicon oxide gas thereby creating a layer of silicon carbide having lattice vacancies. A third carbon donating doping gas is applied to the layer of silicon carbide having lattice vacancies. A third thermal energy beam is directed onto the layer of silicon carbide having lattice vacancies in the presence of third carbon donating doping gas to diffuse carbon into the lattice vacancies to create a carbon rich layer having an atomic structure defining basal planes. A fourth thermal energy beam is focused inside the carbon rich layer for aligning the basal planes of the atomic structure of the carbon rich layer to extend generally outwardly from the substrate to enhance the thermal conductivity between the first and the second regions of the substrate for cooling the silicon substrate.

In another embodiment of the invention, the invention is incorporated into the process of increasing the thermal conductivity in a substrate of a wide bandgap material comprising the steps of providing a substrate of a wide bandgap material having a first and a second region. A doping gas is applied to the wide bandgap material. A thermal energy beam is directed onto the wide bandgap material in the presence of the doping gas for converting a portion of the wide bandgap material into a thermal conducting material to enhance the thermal conductivity between the first and the second regions of the substrate for cooling the wide bandgap material.

In an alternate arrangement of this invention, a first thermal energy beam is directed onto the wide bandgap material in the presence of the first doping gas for converting a portion of the wide bandgap material into a thermal conducting material having an atomic structure defining basal planes. A second thermal energy beam is focused inside the thermal conducting material for aligning the basal planes of the atomic structure of the thermal conducting material to be generally perpendicular to an external surface of the substrate to enhance the thermal conductivity between the first and the second regions of the substrate for cooling the wide bandgap material.

The invention is also incorporated into a non-wide bandgap substrate having enhanced thermal dissipating properties comprising a substrate of a non-wide bandgap material having a first and a second region. A wide bandgap material is formed in situ within the first region of the substrate.

In an alternate arrangement of this invention, a thermal conducting material is formed in situ within a portion of the wide bandgap material to enhance the thermal conductivity between the first and second regions of the substrate for dissipating heat from the second region of the substrate.

In an another alternate arrangement of this invention, a thermal conducting material having an atomic structure defining basal planes is formed in situ within a portion of the wide bandgap material with the basal planes being aligned to extend from an external surface of the substrate to enhance the thermal conductivity between the first and second regions of the substrate for dissipating heat from the second region of the substrate.

In another embodiment of the invention, the invention is incorporated into a silicon substrate having enhanced thermal dissipating properties comprising a substrate of a silicon material having a first and a second region. A silicon carbide material is formed in situ within the first region of the substrate.

In an alternate arrangement of this invention, a silicon substrate having a thermal conducting material is formed in situ within a portion of the silicon carbide material to enhance the thermal conductivity between the first and second regions of the substrate for dissipating heat from the second region of the substrate.

In an another alternate arrangement of this invention, a thermal conducting material having an atomic structure defining basal planes is formed in situ within a portion of the silicon carbide material with the basal planes being aligned generally perpendicular to an external surface of the substrate to enhance the thermal conductivity between the first and second regions of the substrate for dissipating heat from the second region of the substrate.

In another embodiment of the invention, the invention is incorporated into a silicon carbide substrate having enhanced thermal dissipating properties comprising a substrate of a silicon carbide material having a first and a second region. A thermal conducting material is formed in situ within a first region of the silicon carbide material to enhance the thermal conductivity between the first and the second regions of the substrate for dissipating heat from the second region of the substrate.

In an alternate arrangement of this invention, a thermal conducting material having an atomic structure defining basal planes is formed in situ within the first region of the silicon carbide material with the basal planes being aligned to extend generally outwardly relative to an external surface of the substrate to enhance the thermal conductivity between the first and the second regions of the substrate for dissipating heat from the second region of the substrate.

The foregoing has outlined rather broadly the more pertinent and important features of the present invention in order that the detailed description that follows may be better understood so that the present contribution to the art can be more fully appreciated. Additional features of the invention will be described hereinafter which form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be made to the following detailed description taken in connection with the accompanying drawings in which:

FIG. 28 is a side sectional view of the substrate of FIG. 27 with the molecular planes of the layer of carbon thermal conducting material being oriented to be generally perpendicular to an external surface of the substrate formed by focusing a thermal energy beam within the layer of carbon thermal conducting material;

FIG. 29 is a magnified view of a portion of FIG. 28 illustrating the orientation of the molecular planes of the carbon thermal conducting material;

FIG. 30 is a side sectional view of a silicon carbide substrate;

FIG. 31 is a side sectional view of the substrate of FIG. 30 with a layer of the silicon carbide material being converted into a carbon thermal conducting material by a thermal energy beam in the presence of a reacting gas;

FIG. 32 is a side sectional view of the substrate of FIG. 31 with the molecular planes of the layer of carbon thermal conducting material being orientated to extend from the substrate formed by focusing a thermal energy beam within the layer of carbon thermal conducting material;

FIG. 33 is a graph of the thermal conductivity of different materials; and

FIG. 34 is a list of the thermal conductivity of various materials.

Similar reference characters refer to similar parts throughout the several Figures of the drawings.

DETAILED DISCUSSION

Figure 1:
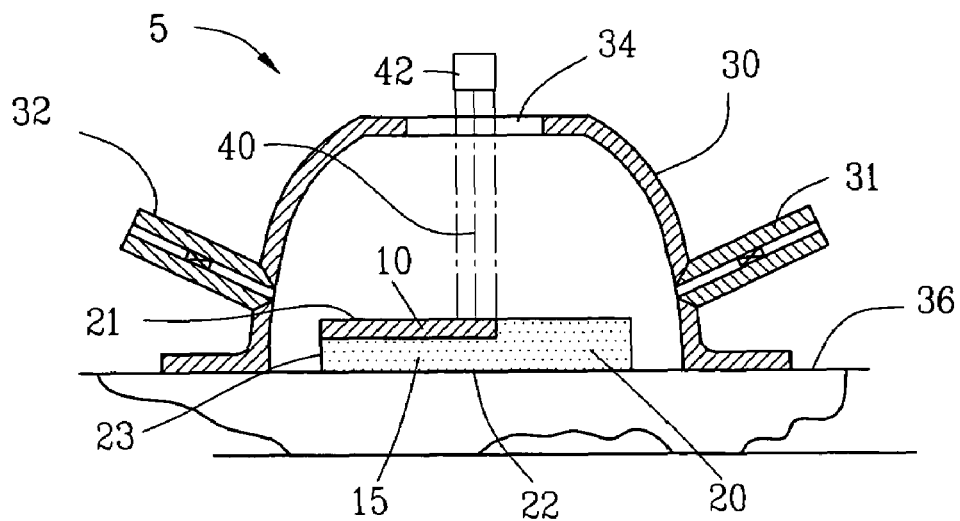
FIG. 1 is a side view of an air-tight chamber with a thermal energy beam impinging on a non-wide bandgap material for forming a layer of a wide bandgap material in the non-wide bandgap material.

FIG. 1 is a side view of an apparatus 5 for forming a layer of a wide bandgap material 10 in a non-wide bandgap material 15. The non-wide-bandgap material 15 is shown as a substrate 20 located in an air-tight chamber 30. The chamber 30 has an inlet and valve combination 31 and outlet and valve combination 32 connected to the side wall of the chamber 30 for injecting and removing gases into and therefrom, respectively. The chamber 30 includes an airtight transmission window 34. The chamber 30 is disposed on a support member 36 forming an airtight seal therewith.

Figure 2:
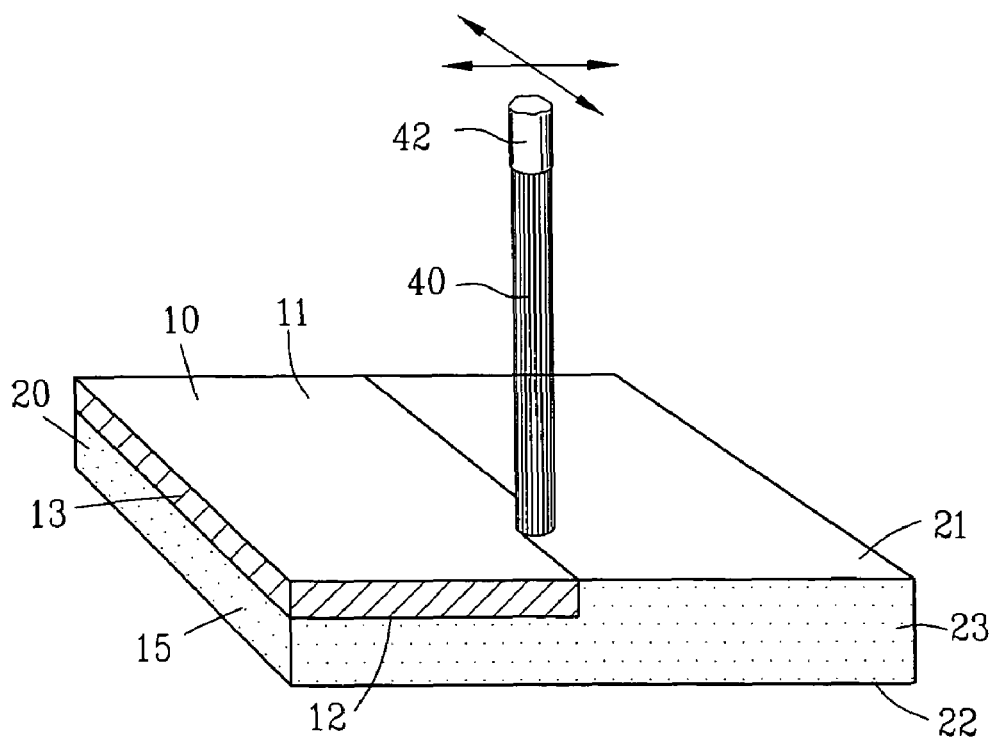
FIG. 2 is an enlarged isometric view of the layer of the wide bandgap material formed in the non-wide bandgap material.

FIG. 2 is an enlarged isometric view of the wide bandgap material 10 formed in the substrate 20 shown in FIG. 1. The wide bandgap material 10 defines a first and a second surface 11 and 12 and a peripheral edge 13. The substrate 20 defines a first and a second surface 21 and 22 and a peripheral edge 23. Although the substrate 20 is shown as a square, the present invention is not limited by the physical configuration of the substrate 20 as shown herein.

A thermal energy beam 40 is shown emanating from a source 42 and passing through the airtight transmission window 34 to impinge on the first surface 21 of the substrate 20. In one example, the thermal energy beam 40 is a beam of charged particles such as a beam of electrons or a beam of ions. In another example, the thermal energy beam 40 is a beam of electromagnetic radiation such as a laser beam. Examples of a suitable source of the laser beam include a Nd:YAG laser, a frequency double $2\bar{\omega}$ Nd:YAG laser or an Excimer laser.

The thermal energy beam 40 is scanned in two dimensions across the first surface 21 of the substrate 20 to form the wide bandgap material 10. In this example, the wide bandgap material 10 is shown partially formed within the first surface 21 of the substrate 20 after a partial scan of the thermal energy beam 40 across the first surface 21 of the substrate 20.

The first surface 11 of the wide bandgap material 10 is coincident with the first surface 21 of the wideband gap semiconductor substrate 20 with the remainder of the wide bandgap material 10 including the second surface 12 and the peripheral surface 13 being embedded between first and second surfaces 21 and 22 of the substrate 20. It should be emphasized that all material interfaces are not discrete but are continuous or diffuse. Lines are used in the figures to show regions only as a convenience.

The substrate 20 may be formed as a monolith or a thin film substrate having suitable properties for forming the wide bandgap material 10. The non-wide bandgap material 15 has a bandgap equal to or less than two electron volts (2 eV). The wide bandgap material 10 has a bandgap greater than two electron volts (2 eV).

Preferably, the non-wide bandgap material 15 is sensitive to a thermal conversion process for transforming a layer of the non-wide bandgap material 15 into the wide bandgap material 10. In one example, the non-wide bandgap material 15 is selected from the group consisting of a silicon material (Si) and a gallium arsenide material (GaAs). Preferably, the non-wide bandgap material 15 is capable of being transformed from a non-wide bandgap material 15 into the wide bandgap material 10 and is capable of being subsequently transformed into an electrical component or device upon further irradiating by the thermal energy beam 40.

Table 1 contrasts various properties of two popular non-wide bandgap semiconductor materials namely silicon (Si) and gallium arsenide (GaAs) with wide bandgap semiconductors namely silicon carbide (SiC) and diamond.

TABLE 1

| Property | Silicon | Gallium Arsenide | 6H Silicon Carbide | Diamond |
|---|---|---|---|---|
| Band Gap | 1.12 eV | 1.424 eV | 3 eV | 5.45 eV |
| Breakdown field | 0.3 MV/cm | 0.4 MV/cm | 3 MV/cm | 10 MV/cm |
| Dielectric constant | 11.7 | 12.9 | 10 | 5.5 |
| Thermal Conductivity | 130 W/K-m | 55 W/K-m | 500 W/K-m | 2200 W/K-m |
| Saturated electron drift velocity | $1 \times 10^7$ cm/sec | $1 \times 10^7$ cm/sec | $2 \times 10^7$ cm/sec | $2.7 \times 10^7$ cm/sec |

Table 1 illustrates the advantageous properties of wide bandgap materials 10. Unfortunately, wide bandgap materials 10 are currently expensive due to high processing costs and poor yields emanating from wafer growth through device packaging. The present invention trans-forms a layer of the non-wide bandgap material 15 into a wide bandgap material 10 to provide the advantages of the properties of the wide bandgap material 10 with the cost advantages of the non-wide bandgap material 15.

The present invention may utilize a conventional semiconductor material such as silicon (Si) or gallium arsenide (GaAs) as the non-wide bandgap material 15. In the alternative, the present invention may utilize a low cost ceramic material such as alumina ($Al_2O_3$) or a low cost glass material such as silica ($SiO_2$).

Figure 3:
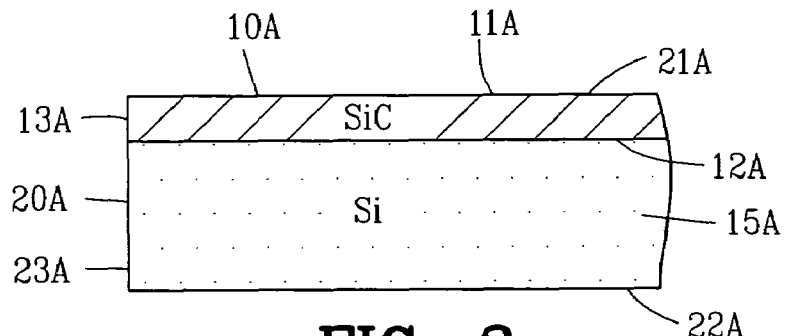
FIG. 3 is an enlarged partial sectional view of a first embodiment of silicon carbide (SiC) wide bandgap material formed in a silicon (Si) non-wide bandgap material.

FIG. 3 is an enlarged sectional view of a first embodiment of the invention illustrating a wide bandgap material 10A formed in the substrate 20A. In this example, the non-wide bandgap material 15A of the substrate 20A is a silicon (Si) material whereas the wide bandgap material 10A is silicon carbide (SiC).

The silicon (Si) non-wide bandgap material 15A is converted into the silicon carbide (SiC) wide bandgap material 10A as the thermal energy beam 40 scans across the first surface 21A of the substrate 20A. The thermal energy beam 40 scans across the first surface 21A of the substrate 20A in an atmosphere of methane gas or acetylene gas. The thermal energy beam 40 heats the silicon atoms of the non-wide bandgap material 15A. The heated silicon atoms of the non-wide bandgap material 15A react with the carbon atoms of the methane gas or acetylene gas atmosphere to create the silicon carbide (SiC) wide bandgap material 10A.

Figure 4:
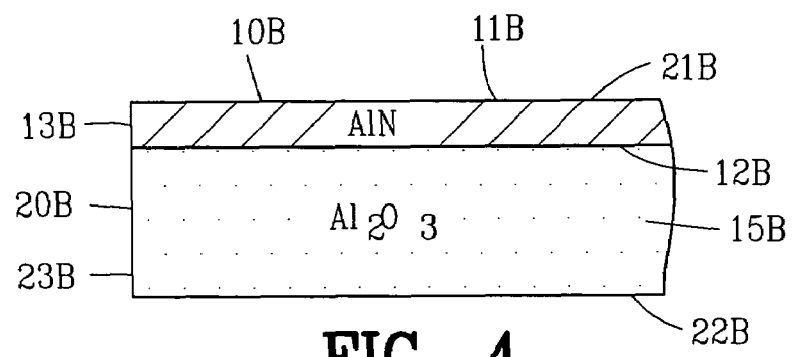
FIG. 4 is an enlarged partial sectional view of a second embodiment of an aluminum nitride (AlN) wide bandgap material formed in an alumina ($Al_2O_3$) wide bandgap material.

FIG. 4 is an enlarged sectional view of a second embodiment of the invention illustrating a wide bandgap material 10B formed in the substrate 20B. In this example, the non-wide bandgap material 15B of the substrate 20B is aluminum oxide ($Al_2O_3$) material whereas the wide bandgap material 10B is aluminum nitride (AlN).

The aluminum oxide ($Al_2O_3$) non-wide bandgap material 15B is converted into the aluminum nitride (AlN) wide bandgap material 10B as the thermal energy beam 40 scans across the first surface 21B of the substrate 20B. The thermal energy beam 40 scans across the first surface 21B of the substrate 20B in an atmosphere of nitrogen to create the aluminum nitride (AlN).

Gallium arsenide (GaAs) non-wide bandgap material (thermal conductivity 55 W/m-K) is converted to gallium nitride (GaN) wide bandgap material (thermal conductivity 130 W/m-K) by this method shown for converting aluminum oxide to aluminum nitride.

Typically, the formation of aluminum nitride (AlN) is not chemical and thermodynamically feasible because of the preferred affinity of aluminum for oxygen. A reacting getter such as source of heated carbon is used to remove the oxygen from reacting with the aluminum since oxygen has preferred reactions with carbon. The carbon can be a solid source or a gaseous source such as methane or acetylene. With the gaseous carbon sources the thermal energy beam 40 would be conducted under a mixed atmosphere of methane and nitrogen in simultaneous or subsequent steps.

The thermal carbon process described above or a similar process is used only when the chemistry of the existing substrate is more stable than that of the desired or new substrate surface composition. Once the oxygen is removed, the surface 21B of the substrate 20B can be scanned with the thermal energy beam 40 in the presence of a doping nitrogen gas to create aluminum nitride (AlN). Subsequently, the aluminum nitride (AlN) wide bandgap material 10B may be converted to semiconductors and conductors, or other device in accordance with the teaching of my previously mentioned U.S. Patents.

Figure 5:
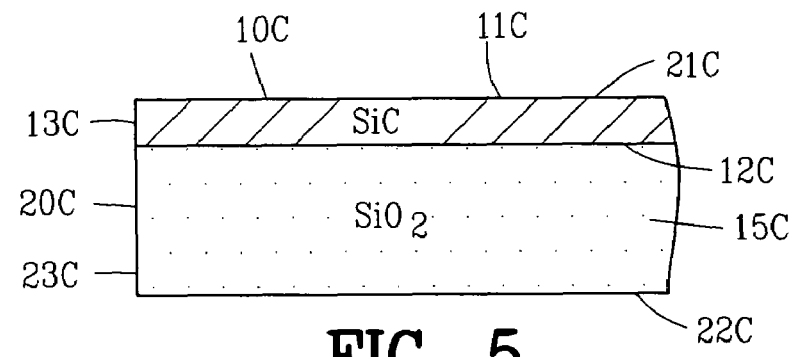
FIG. 5 is an enlarged partial sectional view of a third embodiment of a silicon carbide (SiC) wide bandgap material formed in a silica ($SiO_2$) wide bandgap material.

FIG. 5 is an enlarged sectional view of a third embodiment of the invention illustrating a wide bandgap material 10C formed in the substrate 20C. In this example, the wide bandgap material 15C of the substrate 20C is a silica ($SiO_2$) material whereas the wide bandgap material 10C is silicon carbide (SiC).

The silica ($SiO_2$) wide bandgap material 15C is converted into the silicon carbide (SiC) wide bandgap material 10C as the thermal energy beam 40 scans across the first surface 21C of the substrate 20C. The thermal energy beam 40 scans across the first surface 21C of the substrate 20C in an atmosphere of methane gas or acetylene gas. The thermal energy beam 40 heats the silicon atoms of the wide bandgap material 15C. The heated silicon atoms of the wide bandgap material 15C react with the carbon atoms of the methane gas or acetylene gas atmosphere to create the silicon carbide (SiC) wide bandgap material 10C.

Figure 6:
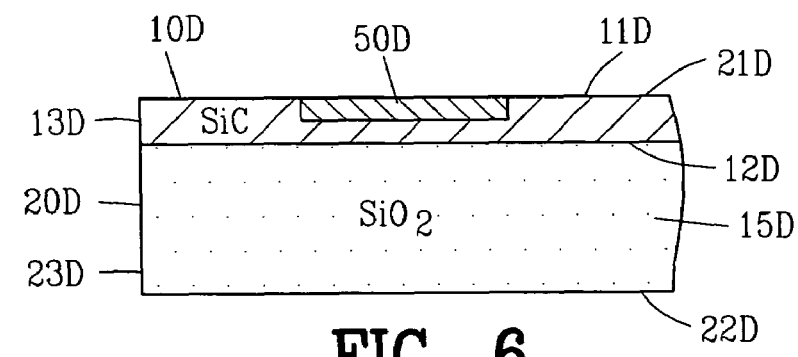
FIG. 6 is an enlarged partial sectional view of a fourth embodiment of a diamond like carbon material formed in the silicon carbide (SiC) wide bandgap material defined in a silica ($SiO_2$) non-wide bandgap material.

FIG. 6 is an enlarged sectional view of a fourth embodiment of the invention illustrating a component 50D defined in a wide bandgap material 10D formed in the substrate 20D. In this example, the component 50 D is a diamond like carbon material (DLC) formed in the silicon carbide (SiC) wide bandgap material 10D defined in a silica ($SiO_2$) wide bandgap material 15D. The silica ($SiO_2$) wide bandgap material 15D is converted into the silicon carbide (SiC) wide bandgap material 10D as the thermal energy beam 40 scans across the first surface 21D of the substrate 20D as set forth with reference to FIG. 3.

After the silica ($SiO_2$) wide bandgap material 15D is converted into the silicon carbide (SiC) wide bandgap material 10D, the silicon carbide (SiC) is converted into the diamond like carbon material (DLC) by selectively removing silicon atoms to create vacancies. The vacancies are then filled with carbon creating the diamond like carbon material (DLC). The thermal energy beam 40 irradiation of the SiC region in a $CO/CO_2$ containing atmosphere diffuses silicon to the surface where the silicon reacts with $CO_2$ to form SiO gas. An increased number of vacancies are left behind in the lattice.

An excimer laser (50 mJ/pulse, 10 Hz pulse repetition rate, 60 pulses, 193 nm wavelength, 20 ns pulse time, CO (partial pressure)/$CO_2$ (partial pressure)=$5 \times 10^4$) creates the temperature range 2000-2300° C. necessary to energize silicon ($SiO_2$) self diffusion in silicon carbide (SiC). Carbon is then diffused into the substrate to fill the vacancies by laser irradiation, for example by (Nd:YAG, excimer etc.) in a methane or acetylene atmosphere to dissociate the hydrocarbon and drive (diffuse) atomic carbon into the silicon carbide (SiC) and if necessary orient or recrystallize the crystal structure.

Figure 7:
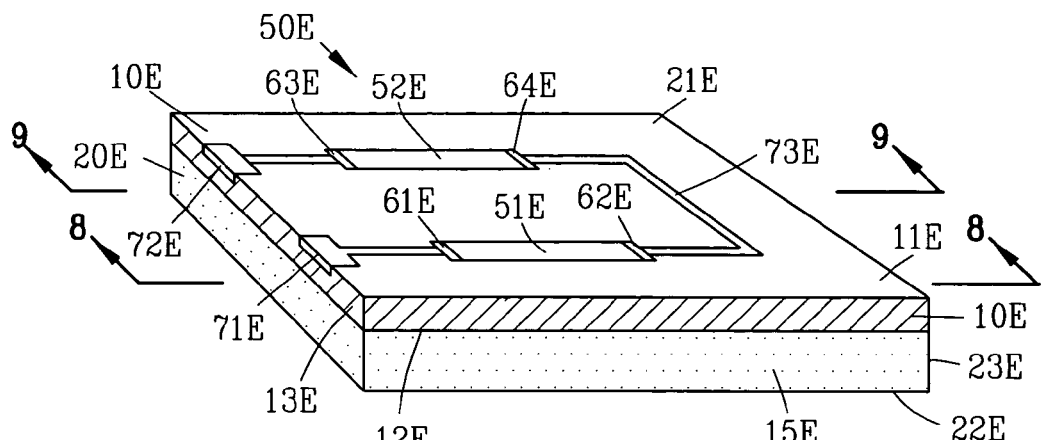
FIG. 7 is an enlarged isometric view of a fifth embodiment of an improved component formed in the wide bandgap material.

FIG. 7 is an enlarged isometric view of a fifth embodiment of the invention illustrating a semiconductor device 50E defined in the wide bandgap material 10E formed in the substrate 20E. The semiconductor device 50E may be one or more of a variety of devices such as an active or passive electrical device, a photonic device, an optical device, a sensor device, a spintronic device or any other suitable semiconductor device. In this example, the semiconductor device 50E is shown as a first semiconductor device 51E and a second semiconductor device 52E.

Figure 8:
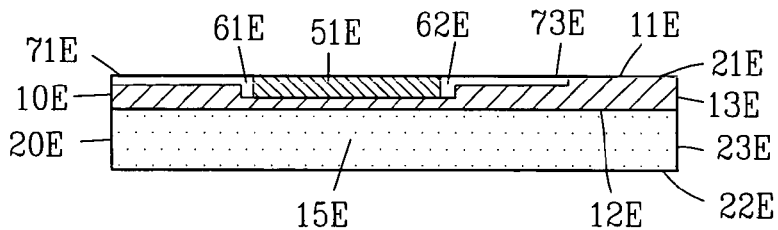
FIG. 8 is a sectional view along line 8-8 in FIG. 7.

FIG. 8 is a sectional view along line 8-8 in FIG. 7 illustrating the first semiconductor device 51E of FIG. 7. The first semiconductor device 51E is defined in the wide bandgap material 10E. The first semiconductor device 51E is connected by an electrode 61E to a first conductor 71E. An electrode 62E connects the first semiconductor device 51E to a connector 73E.

Figure 9:
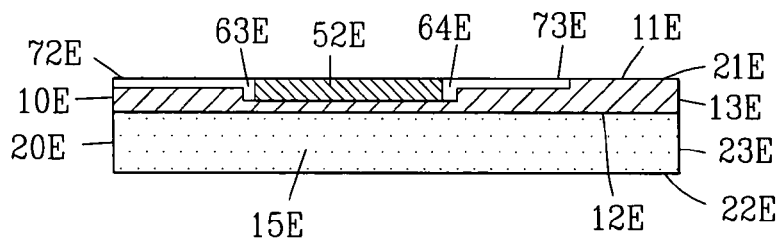
FIG. 9 is a sectional view along line 9-9 in FIG. 7.

FIG. 9 is a sectional view along line 9-9 in FIG. 7 illustrating the second semiconductor device 52E of FIG. 7. The second semiconductor device 52E is defined in the wide bandgap material 10E. The second semiconductor device 52E is connected by an electrode 63E to a second conductor 72E. An electrode 64E connects the second semiconductor device 52E to the connector 73E.

Preferably, the first and/or second semiconductor device 51E and 52E are formed in the wide bandgap material 10E by scanning the thermal energy beam 40 across selected portions of the wide bandgap material 10E in the presence of a doping atmosphere to form the first and/or second semiconductor device 51E and 52E. In the alternative, the first and/or second semiconductor device 51E and 52E may be formed in a conventional manner as should be well known in the art.

Figure 10:
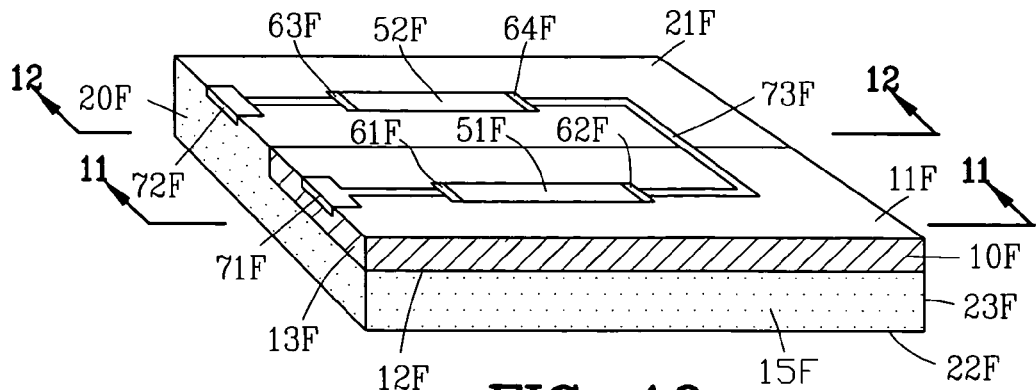
FIG. 10 is an enlarged isometric view of a sixth embodiment of an improved semiconductor device formed in the wide bandgap material.

FIG. 10 is an enlarged isometric view of a sixth embodiment of the invention illustrating a first semiconductor device 51F defined in the wide bandgap material 10F and a second semiconductor device 52F defined in the non-wide bandgap material 15F.

Figure 11:
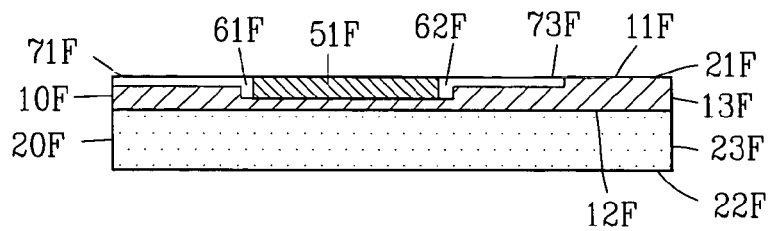
FIG. 11 is a sectional view along line 11-11 in FIG. 10.

FIG. 11 is a sectional view along line 11-11 in FIG. 10 illustrating the first semiconductor device 51F of FIG. 10. The first semiconductor device 51F is defined in the wide bandgap material 10F. The first semiconductor device 51F is connected by an electrode 61F to a first conductor 71F. An electrode 62F connects the first semiconductor device 51F to a connector 73F. The first semiconductor device 51F may be one or more of a variety of devices such as an active or passive electrical device, a photonic device, an optical device, a sensor device, a spintronic device or any other suitable semiconductor device.

Preferably, the first semiconductor device 51F is formed in the wide bandgap material 10F by scanning the thermal energy beam 40 across selected portions of the wide bandgap material 10F in the presence of a doping atmosphere to form the first semiconductor device 51F. In the alternative, the first semiconductor device 51F may be formed in a conventional manner as should be well known in the art.

Figure 12:
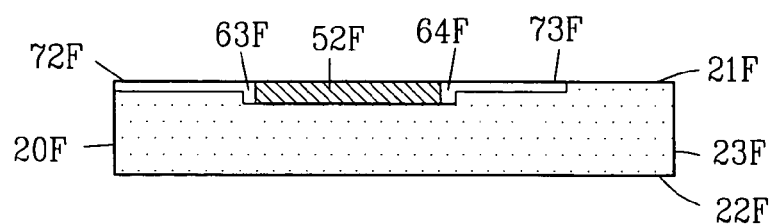
FIG. 12 is a sectional view along line 12-12 in FIG. 10.

FIG. 12 is a sectional view along line 12-12 in FIG. 10 illustrating the second semiconductor device 52F of FIG. 10. The second semiconductor device 52F is defined in the non-wide bandgap material 15F. The second semiconductor device 52F is connected by an electrode 63F to a second conductor 72F. An electrode 64F connects the second semiconductor device 52F to the connector 73F.

Preferably, the second semiconductor device 52F is formed in the non-wide bandgap material 15F in a conventional manner as should be well known in the art. In the alternative, the second semiconductor device 52F may be formed by scanning the thermal energy beam 40 across selected portions of the non-wide bandgap material 15F in the presence of a doping atmosphere to form the second semiconductor device 52F.

The thermal energy beam 40 conversion and doping technology can be applied to the fabrication of conductors, different semiconductor and insulator phases in silicon carbide (SiC). Conductors can be fabricated by doping titanium into silicon carbide (SiC) by laser scanning in a titanium tetra chloride, or other titanium metallo-organic gas atmosphere. Different semiconductor phases can be created by scanning a material with the thermal energy beam 40 in an atmosphere of nitrogen (n-type), phosphine (n-type) or di-borane (p-type), trimethylaluminum (p-type) etc. Insulators can be created by scanning a material with the thermal energy beam 40 in an atmosphere of oxygen.

Figure 13:
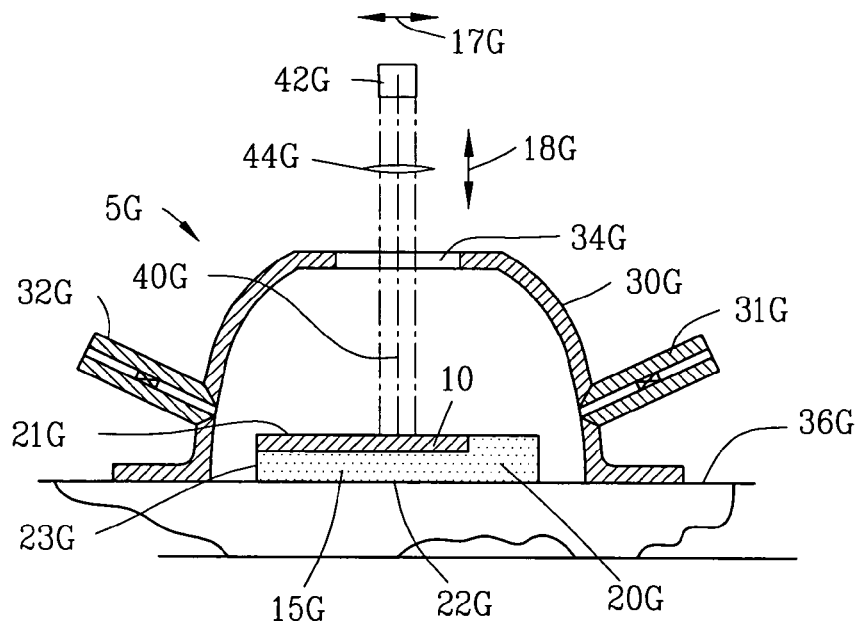
FIG. 13 is a side view of an apparatus similar to FIG. 1 for forming further embodiments of the invention.

FIG. 13 is a side view of an apparatus similar to FIG. 1 for increasing the thermal conductivity in a substrate 20G formed from a non-wide bandgap material 15G. The substrate 20G is located in an air-tight chamber 30G. The chamber 30G has an inlet and valve combination 31G and outlet and valve combination 32G connected to the side wall of the chamber 30G for injecting and removing gases such as doping and/or reacting gasses. An airtight transmission window 34G is located within the chamber 30G. The chamber 30G is disposed on a support member 36G forming an airtight seal therewith.

A thermal energy beam 40G is shown emanating from a source 42G and passing through the airtight transmission window 34G to impinge on the first surface 21G of the substrate 20G. The thermal energy beam 40G may comprise a beam of charged particles such as a beam of electrons or a beam of ions or a beam of electromagnetic radiation such as a laser beam. Examples of a suitable source of the laser beam include a Nd:YAG laser, a frequency double $2\overline{\omega}$ Nd:YAG laser or an Excimer laser.

Figure 14:
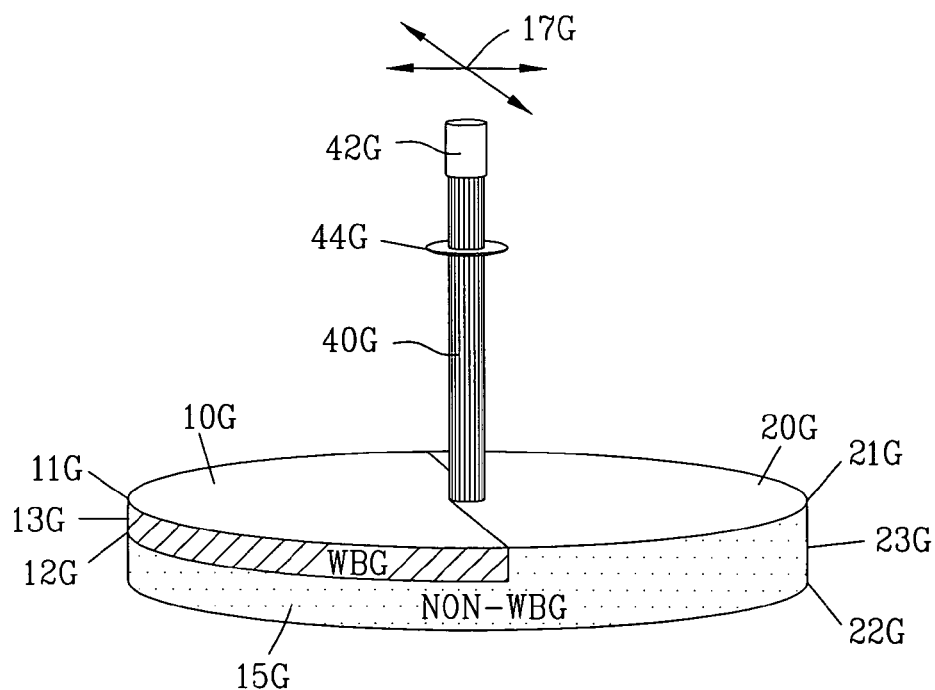
FIG. 14 is a first step in the process of increasing the thermal conductivity in a non-wide bandgap substrate illustrating the scanning of a first thermal energy beam across the substrate in the presence of a doping gas to create a layer of wide bandgap material.

FIG. 14 is an enlarged isometric view of the substrate 20G of the non-wide bandgap material 15G shown in FIG. 13. The non-wide bandgap material 15G is indicated as NON-WBG. The substrate 20G defines a first and a second surface 21G and 22G and a peripheral edge 23G. In this example, a first region of the substrate 20G is located in proximity to the first surface 21G of the substrate 20G whereas a second region of the substrate 20G is located in proximity to the second surface 22G of the substrate 20G.

The substrate 20G may be formed as a monolith or a thin film substrate 20 having suitable properties for forming the wide bandgap material 10G. The non-wide bandgap material 15G has a bandgap equal to or less than two electron volts (2 eV).

The non-wide bandgap material 15G is sensitive to a thermal conversion process. Preferably, the non-wide bandgap material 15G can be transformed from the non-wide bandgap material 15G into the wide bandgap material 10G. Furthermore, the transformed wide bandgap material 10G can be transformed further into a thermal conducting material 50G upon further irradiating by a thermal energy beam 40G. In one example, the non-wide bandgap material 15G is selected from the group consisting of a silicon material (Si), a gallium arsenide material (GaAs), an alumina material ($Al_2O_3$), a silica material ($SiO_2$).

FIG. 14 illustrates a first step in the process of increasing the thermal conductivity in the non-wide bandgap substrate 20G. A doping gas is applied to the first surface 21G of the non-wide bandgap substrate 20G within the air-tight chamber 30G. In one example, the doping gas is selected from the group consisting of methane, acetylene and nitrogen.

The thermal energy beam 40G is scanned in two dimensions as indicated by the arrows 17G across the first surface 21G of the substrate 20G in the presence of the doping gas to form the wide bandgap material 10G within the first region of the substrate 20G. In this example, the wide bandgap material 10G is shown partially formed within the first region of the substrate 20G adjacent to the first surface 21G of the substrate 20G. The wide bandgap material 10G is indicated as WBG. The thermal energy beam 40G continues to scan in two dimensions as indicated by the arrows 17G until the entire first region of the substrate 20G is converted into the wide bandgap material 10G.

The wide bandgap material 10G defines a first and a second surface 11G and 12G and a peripheral edge 13G. The first surface 11G of the wide bandgap material 10G is coincident with the first surface 21G of the substrate 20G with the remainder of the wide bandgap material 10G being embedded between first and second surfaces 21G and 22G of the substrate 20G. The wide bandgap material 10G has a higher thermal conductivity than the non-wide bandgap substrate 20G. The wide bandgap material 10G embedded within the substrate 20G enhances the thermal conductivity between the first and the second regions of the substrate 20G.

The wide bandgap material 10G has a bandgap greater than two electron volts (2 eV). In one example, the wide bandgap material 10G is selected from the group consisting of silicon carbide, diamond, diamond like carbon, aluminum nitride, boron nitride and gallium nitride.

FIGS. 13-14 illustrates a line interface separating the wide bandgap material 10G and the non-wide bandgap material 15G. However, it should be appreciated that the actual interface between the wide bandgap material 10G and the non-wide bandgap material 15G is a continuous or a diffuse interface.

Figure 15:
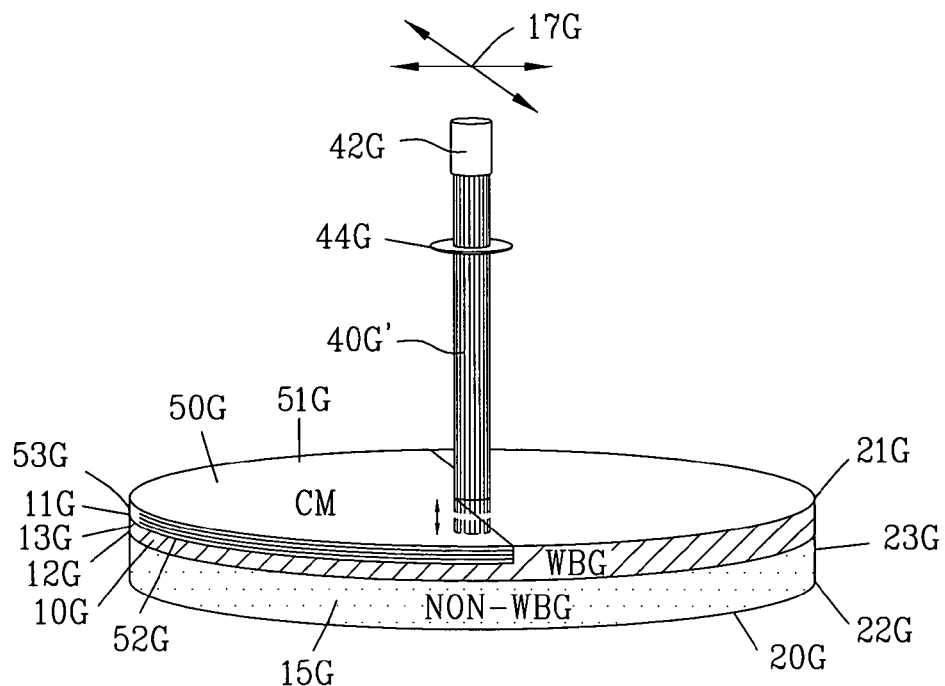
FIG. 15 is a second step in the process of increasing the thermal conductivity in a substrate illustrating the scanning of a second thermal energy beam across the layer of wide bandgap material create a layer of thermal conducting material in the wide bandgap material.

FIG. 15 illustrates the forming of thermal conducting material 50G within the wide bandgap material 10G of the substrate 20G. The thermal conducting material 50G is indicated as CM. A second doping gas is applied to the wide bandgap material 10G. A second thermal energy beam 40G' is scanned across the wide bandgap material 10G of the substrate 20G. The irradiation of the wide bandgap material 10G of the substrate 20G by the second thermal energy beam 40G' in the presence of the second doping gas converts a portion of the wide bandgap material 10G into a layer of thermal conducting material 50G. The second thermal energy beam 40G' continues to scan in two dimensions as indicated by the arrows 17G until the entire first region of the substrate 20G is converted into the thermal conducting material 50G.

The thermal conducting material 50G defines a first and a second surface 51G and 52G and a peripheral edge 53G. The first surface 51G of the thermal conducting material 50G is coincident with the first surface 11G of the wide bandgap material 10G with the remainder of the thermal conducting material 50G being embedded between first and second surfaces 11G and 12G of the wide bandgap material 10G.

The thermal conducting material 50G has a higher thermal conductivity than the wide bandgap material 10G. The thermal conducting material 50G embedded within the wide bandgap material 10G further enhances the thermal conductivity between the first and the second regions of the substrate 20G.

In many examples, the thermal conducting material 50G is formed within the wide bandgap material 10G having molecular planes including basal planes 55G. The second thermal energy beam 40G' forms the basal planes 55G that are disposed parallel to an external surface of the substrate 20G. In this example, the external surface of the substrate 20G is shown as the first surface 21G of the substrate 20G.

Figure 16:
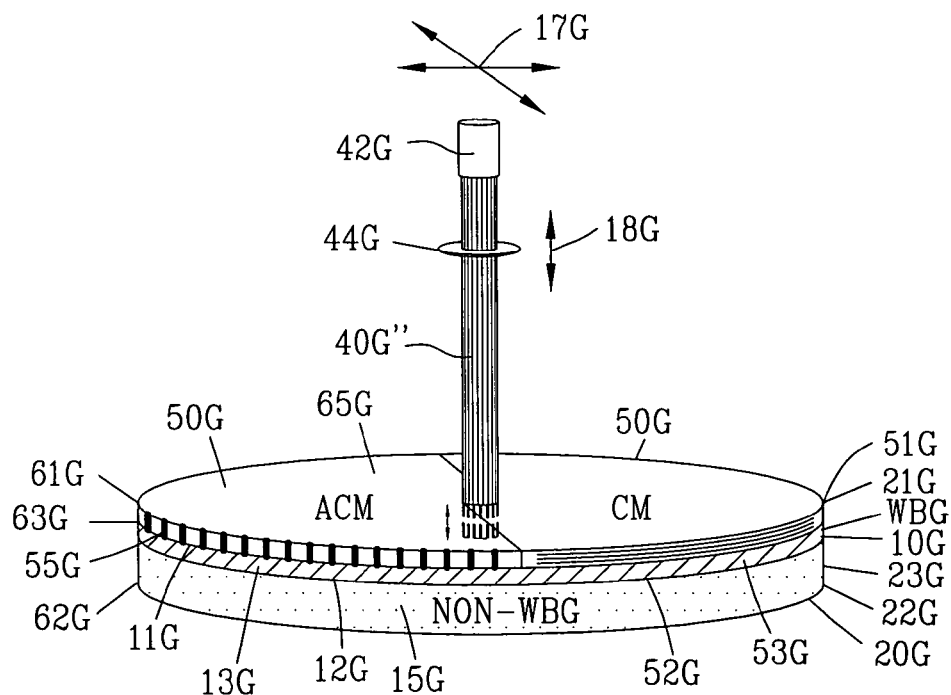
FIG. 16 is a third step in the process of increasing the thermal conductivity in a substrate illustrating the focusing of a third thermal energy beam inside of the thermal conducting material to aligning the molecular planes of the thermal conducting material to extend outwardly from the substrate.

FIG. 16 illustrates the focusing of a third thermal energy beam 40G" inside of the thermal conducting material 50G. The third thermal energy beam 40G" is scanned in two dimensions across the thermal conducting material 50G while simultaneously altering the focal point of the third thermal energy beam 40G" inside of the thermal conducting material 50G. Initially, the focal point of the third thermal energy beam 40G" is positioned inside of the thermal conducting material 50G with the focal point being gradually moved toward the external surface or the first surface 21G of the substrate 20G.

The altering of the focal point of the third thermal energy beam 40G" inside of the thermal conducting material 50G orientates the basal planes 55G of the thermal conducting material 50G to extend from the substrate 20G. In this example, the altering of the focal point of the third thermal energy beam 40G" inside of the thermal conducting material 50G aligns the basal planes 55G to be generally perpendicular to the external surface or the first surface 21G of the substrate 20G. The alignment of the basal planes 55G of the thermal conducting material 50G to extend from the external surface of the substrate 20G further enhances the thermal conductivity between the first and the second regions of the substrate 20G. The thermal conducting material 50G having aligned basal planes 55G is indicated as ACM.

Figure 17:
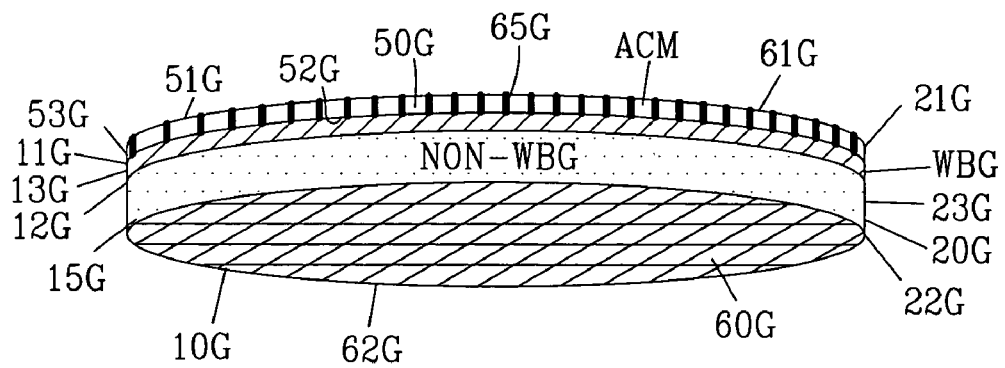
FIG. 17 illustrates the cutting is a substrate into a plurality of dies.

FIG. 17 illustrates the substrate 20G severed into a plurality of dies 60G. Each of the plurality of dies 60G defines a first region 61G and a second region 62G. The first region 61G comprises the thermal conducting material 50G whereas the second region 62G comprises the non-wide bandgap material 15G.

Figure 18:
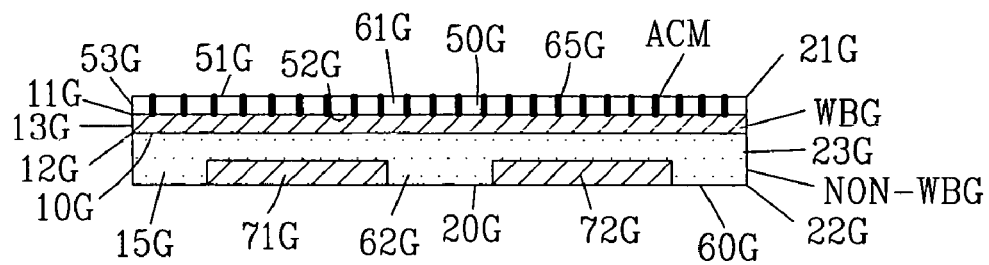
FIG. 18 is a side sectional view of one of the plurality of dies of FIG. 17 incorporating electronic components with the increasing the thermal conductivity in a substrate cooling the electronic components.

FIG. 18 is a side sectional view of one of the plurality of dies 60G of FIG. 17. The basal planes 55G of the thermal conducting material 50G act as a plurality of micro fins 65G extending in a parallel relationship to be orientated generally perpendicular to the external surface shown as the first surface 21G of the substrate 20G. The plurality of micro fins 65G effectively increase the surface area of first region 61G for increasing the transfer of heat between the first region 61G of the die 60G and an ambient such as ambient air or ambient vacuum. The plurality of micro fins 65G creates an integral heat exchanger with the substrate 20G.

The die 60G may be further fabricated into various types of devices such as sensors, detectors, electrical components, integrated circuits and the like. In this example, plural electronic components 71G and 72G are formed within the non-wide bandgap material 15G. Preferably, the plural electronic components 71G and 72G are formed in the non-wide bandgap material 15G in a conventional manner as should be well known in the art. In the alternative, the plural electronic components 71G and 72G may be formed by scanning the thermal energy beam 40 across selected portions of the non-wide bandgap material 15G in the presence of a doping atmosphere to form the plural electronic components 71G and 72G.

It is evident that increased thermal conductivity of the dies 60G may transfer heat from the plural electronic components 71G and 72G on the second region 62G to the first region 61G to cool the plural electronic components 71G and 72G. However, it should be appreciated by those skilled in the art that increased thermal conductivity of the die 60G can transfer heat from the first region 61G to heat the plural electronic components 71G and 72G on the second region 62G.

Figure 19:
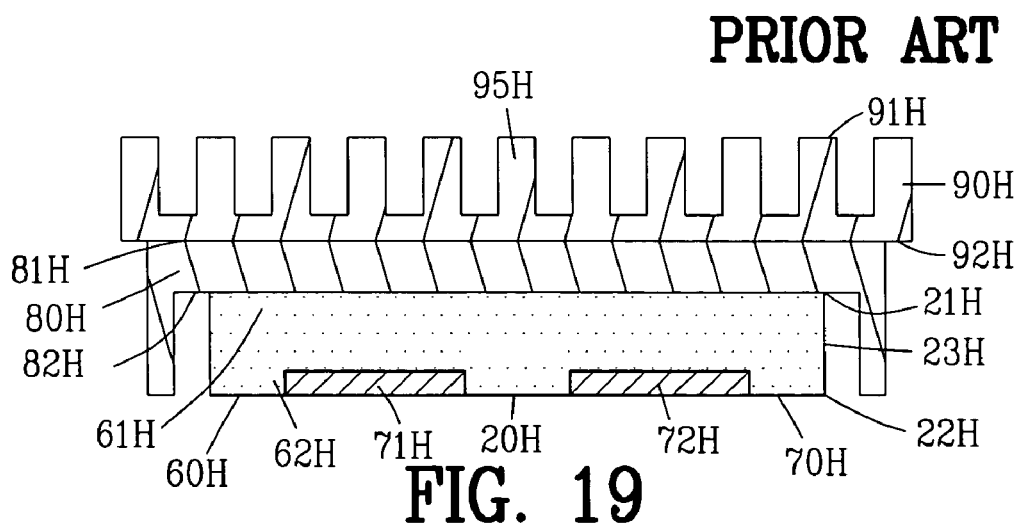
FIG. 19 is a side sectional view of a convention die of the prior art incorporated into a conventional heat spreader and a conventional heat sink of the prior art.

FIG. 19 is a side sectional view of a convention die 60H of the prior art incorporated into a conventional heat spreader 80H and a conventional heat sink 90H of the prior art. The die 60H defines a first region 61H and a second region 62H. Plural electronic components 71H and 72H are located on the second region 62H of the die 60H.

The conventional heat spreader 80H defines a first surface 81H and a second surface 82H whereas the conventional heat sink 90H defines a first surface 91H and a second surface 92H. The first surface 91H of the conventional heat sink 90 defines a plurality of fins 95H.

Heat generated by the plural electronic components 71H and 72H is transferred from the second region 62H to the first region 61H of the die 60H. Heat from the first region 61H of the die 60H is transferred through the heat spreader 80H to the heat sink 90H. The thermal conductivity between the first region 61H of the die 60H and the plurality of fins 95H is substantially reduced by the interfaces located at the first and second surfaces 81H and 82H of the conventional heat spreader 80H.

The die 60G of the present invention incorporates several advantages over the die 60H of the prior art. Firstly, the substrate 20G has a higher thermal conductivity due to the presence of the wide bandgap material 10G and/or the presence of the thermal conducting material 50G. Secondly, the interfaces between the non-wide bandgap material 15G, the wide bandgap material 10G and/or the thermal conducting material 50G do not impede the thermal conductivity between the first region and second regions 61G and 62G of the die 60G. Thirdly, the die 60G of the present invention is an integral unit in contrast to the assembly of the die 60H of the prior art. Finally, the die 60G of the present invention is smaller than the assembly of the die 60H of the prior art.

FIGS. 20-23 illustrate a process for increasing the thermal conductivity of a substrate 20I formed from a silicon material 15I. The process for increasing the thermal conductivity shown in FIGS. 20-23 may or may not be a part of the prior art.

Figure 20:
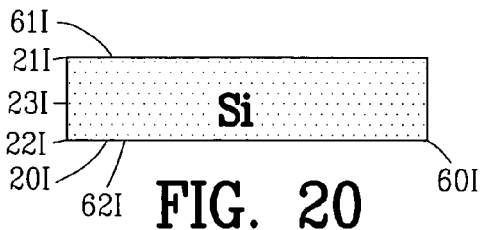
FIG. 20 is a side sectional view of a silicon substrate.

FIG. 20 is a side sectional view of a silicon substrate 20I formed from a silicon material 15I. The substrate 20I defines a first and a second surface 21I and 22I and a peripheral edge 23I. In this example, a first region 61I of the substrate 20I is located in proximity to the first surface 21I of the substrate 29I whereas a second region 62I of the substrate 20I is located in proximity to the second surface 22I of the substrate 20I.

Figure 21:
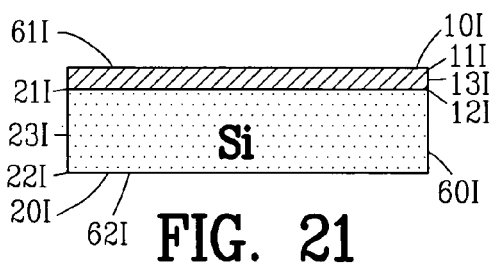
FIG. 21 is a side sectional view of the silicon substrate of FIG. 20 with a layer of silicon carbide material deposited onto the silicon substrate by a conventional vapor deposition process.

FIG. 21 is a side sectional view of the silicon substrate 20I of FIG. 20 with a layer of silicon carbide material 10I deposited onto the first side 21I of the silicon substrate 20I by a conventional vapor deposition process. The process of depositing a silicon carbide material 10I onto a substrate 20I by a conventional vapor should be well known to those skilled in the art.

Figure 22:
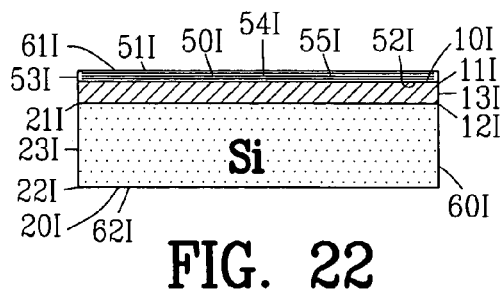
FIG. 22 is a side sectional view of the substrate of FIG. 21 with a layer of carbon thermal conducting material deposited onto the silicon carbide material by a conventional vapor deposition process.

FIG. 22 is a side sectional view of the substrate 20I of FIG. 21 with a layer of thermal conducting material 50I deposited onto the silicon carbide material 50I by a conventional vapor deposition process. The thermal conducting material 50I is shown as a carbon material 54I.

Figure 23:
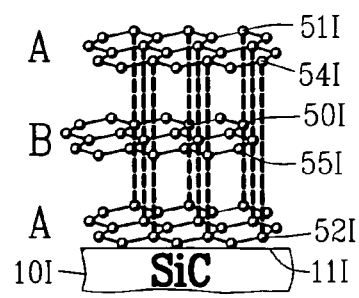
FIG. 23 is a magnified view of a portion of FIG. 22 illustrating the alignment of the molecular planes of the carbon thermal conducting material.

FIG. 23 is a magnified view of a portion of FIG. 22 illustrating the alignment of the molecular basal planes 55I of the carbon material 54I. The basal planes 55I of the carbon material 54I are shown as planes A-B-A. The planes A-B-A of the basal planes 55I are formed to be generally parallel to the first side 21I of the silicon substrate 20I by the conventional vapor deposition process.

FIGS. 20-23 illustrate a process for increasing the thermal conductivity of a substrate 20I formed from a silicon material 15I.

The process for increasing the thermal conductivity shown in FIGS. 20-23 increases the thickness of the assembly as the layers of silicon carbide material 10I and the thermal conducting material 50I are added onto the silicon substrate 20I. Furthermore, the conventional vapor deposition processes creates an interface between the silicon substrate 20I and the silicon carbide material 10I as well as creating an interface between the silicon carbide material 10I and the thermal conducting material 50I.

FIGS. 24-29 illustrate a process of the present invention for increasing the thermal conductivity of a substrate 20J formed from a silicon material 15J. As will be described in greater detail hereinafter, the process utilizes the thermal energy beams in a manner similar to the process shown in FIGS. 13-16.

Figure 24:
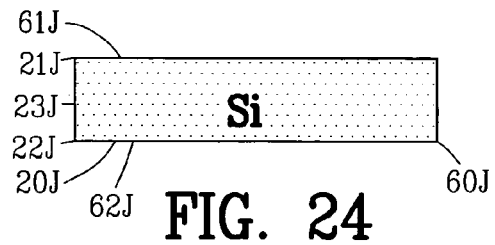
FIG. 24 is a side sectional view of a silicon substrate.

FIG. 24 is a side sectional view of a silicon substrate 20J formed from a silicon material 15J. The substrate 20J defines a first and a second surface 21J and 22J and a peripheral edge 23J. In this example, a first region 61J of the substrate 20J is located in proximity to the first surface 21J of the substrate 20J whereas a second region 62J of the substrate 20J is located in proximity to the second surface 22J of the substrate 20J.

Figure 25:
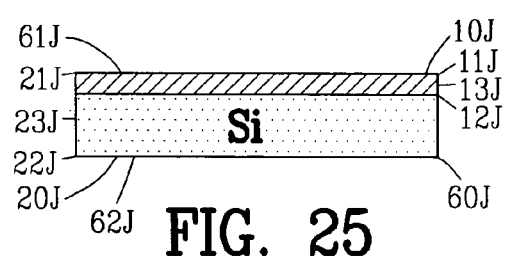
FIG. 25 is a side sectional view of the silicon substrate of FIG. 24 with a layer of the silicon material being converted into silicon carbide material by a thermal energy beam in the presence of a doping gas.

FIG. 25 is a side sectional view of the silicon substrate 20J of FIG. 24 with a portion of the first region 61J being converted into a layer of silicon carbide material 10J. A first thermal energy beam (not shown) is scanned in two dimensions across the first region 61J in the presence of a carbon donating doping gas to form the wide bandgap material 10J within the first region of the substrate 20J. The first carbon donating doping gas may be selected from the group consisting of methane and acetylene. The silicon carbide material 10J formed in the substrate 20J can be up to 600 nanometers or greater depending upon the intended geometry and cooling requirements as well as the intended application and use of the silicon substrate 20J.

Table 2 lists various parameters for converting a portion of the silicon substrate 20J into a layer of silicon carbide material 10J.

TABLE 2

| Laser Type | KrF Excimer | ArF Excimer |
| --- | --- | --- |
| Wavelength (nm) | 248 | 193 |
| Laser Fluence (J/cm²) | 1.5 | 1.0 |
| Pulse Repetition Rate (kHz) | 1.0 | 1.0 |
| Number of Pulses | 600 | 600 |
| Beam Area (2 mm × 2.5 mm) | 5.0 | 5.0 |

TABLE 2-continued

| Laser Type | KrF Excimer | ArF Excimer |
| --- | --- | --- |
| Scanning Plane (mm/s) | X-Y (surface) | |
| Atmosphere | Methane | |

Figure 26:
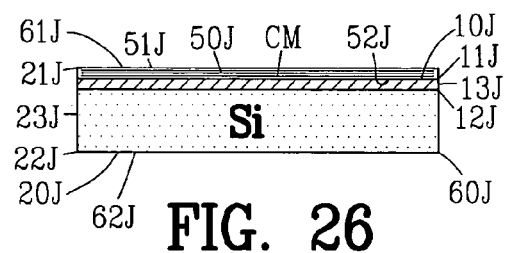
FIG. 26 is a side sectional view of the substrate of FIG. 25 with a layer of the silicon carbide material being converted into a carbon thermal conducting material by a thermal energy beam in the presence of a reacting gas.

FIG. 26 is a side sectional view of the substrate 20J of FIG. 25 with a portion of the silicon carbide material 10J being converted into a layer of thermal conducting carbon material 50J. A second thermal energy beam (not shown) is scanned in two dimensions across the wide bandgap material 10J in the presence of second reacting gas.

The second thermal energy beam (not shown) in combination with the second reacting gas diffuses silicon of the silicon carbide material 10J to the first surface 11J thereby creating a layer of silicon carbide material 10J having lattice vacancies. The second reacting gas may be selected from the group consisting of carbon monoxide and carbon dioxide. The carbon monoxide and/or carbon dioxide reacts with the diffused silicon to form a silicon oxide gas and prevents oxidation of the substrate surface.

Table 3 lists various parameters for creating a layer of silicon carbide material 10J having lattice vacancies.

TABLE 3

| Laser Type | Excimer |
| --- | --- |
| Wavelength (nm) | 193 |
| Energy Pulse (mJ/pulse) | 260 |
| Pulse Repetition Rate (Hz) | 10 |
| Number of Pulses | 60 |
| Pulse Time (nsec) | 20 |
| Beam Area (2 mm × 2.5 mm) | 5.0 |
| Scanning Plane (mm/s) | X-Y (surface) |
| Atmosphere | $\frac{CO\ partial\ pressure}{CO_2\ partial\ pressure} = 5 \times 10^4$ |

A third thermal energy beam (not shown) is directed onto the layer of silicon carbide material 10J having lattice vacancies in the presence of a third carbon donating doping gas to diffuse carbon into the lattice vacancies to create a carbon rich layer having an atomic structure defining basal planes 55J. The third carbon donating doping gas may be selected from the group consisting of methane and acetylene.

Table 4 lists various parameters for diffusing carbon into the lattice vacancies to create a carbon rich layer having an atomic structure defining basal planes 55J.

TABLE 4

| Laser Type | KrF Excimer | ArF Excimer |
| --- | --- | --- |
| Wavelength (nm) | 248 | 193 |
| Laser Fluence (J/cm²) | 1.5 | 1.0 |
| Pulse Repetition Rate (kHz) | 1.0 | 1.0 |
| Number of Pulses | 600 | 600 |
| Beam Area (2 mm × 2.5 mm) | 5.0 | 5.0 |
| Scanning Plane (mm/s) | X-Y (surface) | |
| Atmosphere | Methane | |

Figure 27:
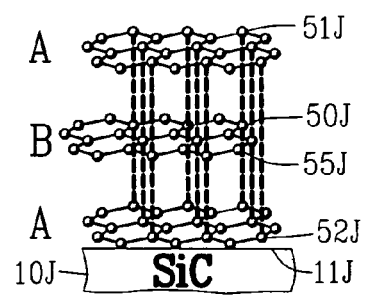
FIG. 27 is a magnified view of a portion of FIG. 26 illustrating the alignment of the molecular planes of the carbon thermal conducting material.

FIG. 27 is a magnified view of a portion of FIG. 26 illustrating the alignment of the crystal lattice basal planes 55J of the carbon material 54J. The basal planes 55J of the carbon material 54J are shown as planes A-B-A. The planes A-B-A of the basal planes 55J are formed to be generally parallel to the first side 21J of the silicon substrate 20J.

FIG. 28 is a side sectional view of the silicon substrate 20J of FIG. 27 with the crystal lattice basal planes 55J of the carbon material 54J being orientated generally perpendicular to the first surface 21J of the substrate 20J. A fourth thermal energy beam (not shown) is focused inside the carbon material 54J for aligning the basal planes 55J of the carbon material 54J to be generally perpendicular to an external surface of the substrate to enhance the thermal conductivity between the first and the second regions of the substrate for cooling the silicon substrate.

The fourth thermal energy beam (not shown) is scanned in two dimensions across the carbon material 54J while simultaneously altering the focal point inside of the carbon material 54J. The focal point of the fourth thermal energy beam (not shown) is positioned inside of the carbon material 54J with the focal point being gradually moved toward the first surface 21J of the substrate 20J. The movement of the focal point of the fourth thermal energy beam (not shown) within the carbon material 54J aligns the basal planes 55J of the carbon material 54J to be generally perpendicular to an external surface shown as the first surface 21J of the substrate 20J.

The three dimensional movement of the fourth thermal energy beam (not shown) within the carbon material 54J results in the melting and/or solid state diffusion of the basal planes 55J formed generally parallel to the first side 21J of the silicon substrate 20J. The three dimensional movement of the fourth thermal energy beam (not shown) further results in the controlled crystallization or recrystallization of the basal planes 55J to be generally perpendicular to the first surface 21J after the melting and/or solid state diffusion. The aligned basal planes 55J oriented generally perpendicular to an external surface shown as the first surface 21J of the substrate 20J can be up to 500 nm or greater depending upon the intended geometry and cooling requirements as well as the intended application and use of the silicon substrate 20J.

Table 5 lists various parameters for aligning the basal planes 55J of the carbon material 54J to be generally perpendicular to an external surface shown as the first surface 21J of the substrate 20J.

TABLE 5

| Laser Type | Nd:YAG |
| --- | --- |
| Wavelength (nm) | 1064 |
| Pulse Width (nsec) | 260 |
| Pulse Repetition Rate (kHz) | 35 |
| Power (W) | 69.3 |
| Beam Diameter (μm) | 1.0 |
| Beam Scan Rate (mm/s) | 5.0 |
| Scanning Plane (mm/s) | Z-Y, Z-X, Z perpendicular to substrate |
| Atmosphere | Air or Argon |

FIG. 29 is a magnified view of a portion of FIG. 28 illustrating the alignment of the molecular basal planes 55J of the carbon material 54J. The basal planes 55J of the carbon material 54J are shown as planes A-B-A. The planes A-B-A of the basal planes 55J are formed to be generally perpendicular to the first side 21J of the silicon substrate 20J. In this specification, the term aligning the basal planes 55J to be generally perpendicular to the external surface to the first side 21J of the silicon substrate 20J should be interpreted as a statistical significant number of molecules of the carbon material 54J being oriented within forty-five degrees of a perpendicular extending from the external surface of the first side 21J of the silicon substrate 20J.

FIGS. 30-32 illustrate a process of the present invention for increasing the thermal conductivity of a substrate 20K formed from a silicon carbide material 10K. The process utilizes thermal energy beams in a manner similar to the process shown in FIGS. 26-28.

FIG. 30 is a side sectional view of a substrate 20K formed from a silicon carbide material 10K. The substrate 20K defines a first and a second surface 21K and 22K and a peripheral edge 23K. A first region 61K of the substrate 20K is located in proximity to the first surface 21K of the substrate 20K whereas a second region 62K of the substrate 20K is located in proximity to the second surface 22K of the substrate 20K.

FIG. 31 is a side sectional view of the substrate 20K of FIG. 30 with a portion of the silicon carbide material 10K being converted into a layer of thermal conducting carbon material 50K. A first thermal energy beam (not shown) is scanned in two dimensions across the wide bandgap material 10K in the presence of a reacting gas.

The first thermal energy beam in combination with the reacting gas diffuses silicon of the silicon carbide to the first surface 21K thereby creating a layer of silicon carbide having lattice vacancies. The silicon carbide at the first surface 21K reacts with the reacting gas to form a silicon oxide gas. The reacting gas may be selected from the group consisting of carbon monoxide and carbon dioxide.

A second thermal energy beam is directed onto the layer of silicon carbide having lattice vacancies in the presence of a carbon donating doping gas to diffuse carbon into the lattice vacancies to create a carbon rich layer having an atomic structure defining basal planes 55K. The basal planes 55K are formed to be generally parallel to the first side 21K of the substrate 20K in a manner similar to the basal planes 55J shown in FIG. 27. The carbon donating doping gas may be selected from the group consisting of methane and acetylene.

FIG. 32 is a side sectional view of the substrate 20K of FIG. 31 with the crystal lattice basal planes 55K of the carbon material 54K being aligned generally perpendicular to the first surface 21K of the substrate 20K. A third thermal energy beam (not shown) is focused inside the carbon material 54K for aligning the basal planes 55K of the carbon material 54K to be generally perpendicular to an external surface of the substrate 20K to enhance the thermal conductivity between the first and the second regions 61K and 62K of the substrate 20K for cooling the substrate 20K.

The fourth thermal energy beam (not shown) is scanned in two dimensions across the carbon material 54K while simultaneously altering the focal point of the inside carbon material 54K. The movement of the focal point of the fourth thermal energy beam (not shown) within the carbon material 54K aligns the basal planes 55K of the carbon material 54K to be generally perpendicular to an external surface in a manner similar to the basal planes 55J shown in FIG. 29.

FIG. 33 is a graph of the thermal conductivity of different carbon materials. The thermal conductivity of diamond or diamond like carbon material is compared to the thermal conductivity of graphite along the basal planes A-B-A and the thermal conductivity of graphite normal to the basal planes A-B-A. The thermal conductivity of graphite along the basal planes A-B-A is significantly greater than the thermal conductivity of graphite normal to the basal planes A-B-A.

The incorporation of the carbon material 54J within the silicon carbide material 10J increases the thermal conductivity of the silicon substrate 20J irrespective of the orientation of the basal planes 55J. A greater thermal conductivity of the silicon substrate 20J is achieved when the basal planes 55J are aligned generally perpendicular to an external surface 21J of the silicon substrate 20J. The greatest thermal conductivity of the silicon substrate 20J is achieved with a diamond or diamond like carbon material. Although the carbon material 54J is shown as a graphite structure in FIGS. 23, 27 and 29, it should be understood that the carbon material 54J can actually have various degrees or types of crystalline structure.

In another example of the invention the silicon substrate is first converted to a silicon carbide region using the process parameters given in Table 2. The silicon carbide is then simultaneously converted into a carbon rich region (75-100 atomic % carbon) using the process parameters given in Table 5 where scanning is in the x-y plane.

In another example of the invention the silicon substrate is first converted to a silicon carbide region using the process parameters given in Table 2. The silicon carbide is then simultaneously converted into a carbon rich graphite-like region (75-100 atomic % carbon) that has basal planes generally oriented generally perpendicular to the substrate surface using the process parameters given in Table 5 where scanning is in the z-x and z-y plane.

FIG. 34 is a listing of the thermal conductivity of various materials. The thermal conductivity of silicon carbide is three times greater than the thermal conductivity of silicon. Referring back to FIG. 25, the silicon carbide material 10J formed in situ within a first region 61J of the silicon material 20J enhances the thermal conductivity between the first and the second regions 61J and 62J of the substrate 60J for dissipating from the second region 61J of the substrate 20J.

The present invention provides a process for forming a wide bandgap material within a non-wide bandgap or a wide bandgap substrate to enhance the thermal conductivity and heat dissipation of the substrate. A thermal conducting material may be formed in situ within a wide bandgap material to enhance further the thermal conductivity and heat dissipation thereof. The formation of the wide bandgap material and/or the thermal conducting material in situ creates a continuous or diffuse boundary as opposed to a discrete boundary and matches the coefficient of thermal expansion of the prior art.

The present disclosure includes that contained in the appended claims as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. The process of increasing the thermal conductivity in a silicon substrate, comprising the steps of:
providing a substrate of a silicon material having a first and a second region located between and adjacent to a first and a second surface of the substrate, respectively;
applying a first carbon donating doping gas to the first substrate surface of the silicon substrate; and
directing a first thermal energy beam onto the first substrate surface of the silicon substrate in the presence of the first carbon donating doping gas for converting the first region of the silicon substrate between the first and second substrate surfaces into silicon carbide to enhance the thermal conductivity between the first and the second regions of the substrate for cooling the silicon substrate.

2. The process as set forth in claim 1, wherein the step of applying the first carbon donating doping gas includes applying a doping gas selected from the group consisting of methane and acetylene.

3. The process as set forth in claim 1, wherein the step of directing the first thermal energy beam includes directing a laser beam onto the first region of the silicon substrate in the presence of the first carbon donating doping gas.

4. The process of increasing the thermal conductivity in a silicon substrate, comprising the steps of:
applying a first carbon donating doping gas to providing a substrate of a silicon material having a first and a second region; the first region of the silicon substrate;
directing a first thermal energy beam onto the first region of the silicon substrate in the presence of the first carbon donating doping gas for converting the first region of the silicon substrate into silicon carbide to enhance the thermal conductivity between the first and the second regions of the substrate for cooling the silicon substrate; and
applying a reacting gas to the silicon carbide; and
directing a second thermal energy beam onto the silicon carbide in the presence of the reacting gas to diffuse silicon to a surface of the silicon carbide to react the diffused silicon with the reacting gas to form a silicon gas thereby creating a layer of silicon carbide having lattice vacancies.

5. The process as set forth in claim 4, wherein the step of applying a reacting gas to the silicon carbide includes applying a carbon monoxide-carbon dioxide gas mixture to the silicon carbide.

6. The process as set forth in claim 4, including the steps of applying a reacting gas selected from the group consisting of carbon monoxide and carbon dioxide to the silicon carbide; and
directing a second laser energy beam onto the silicon carbide in the presence of the reacting gas to diffuse silicon to the surface and react the diffused silicon with oxygen to form silicon oxide gas thereby creating a layer of silicon carbide having lattice vacancies.

7. The process as set forth in claim 6, including the steps of applying a third carbon donating doping gas to the layer of silicon carbide having lattice vacancies; and
directing a third thermal energy beam onto the layer of silicon carbide having lattice vacancies in the presence of third carbon donating doping gas to diffuse carbon into the lattice vacancies to create a carbon rich layer having an atomic structure defining basal planes.

8. The process as set forth in claim 6, including the steps of applying a third carbon donating doping gas selected from the group consisting of methane and acetylene to the layer of silicon carbide having lattice vacancies; and
directing a third thermal energy beam onto the layer of silicon carbide having lattice vacancies in the presence of third carbon donating doping gas to diffuse carbon into the lattice vacancies to create a carbon rich layer having an atomic structure defining basal planes.

9. The process as set forth in claim 7, including the steps of focusing a fourth thermal energy beam inside the carbon rich layer for aligning the basal planes of the atomic structure of the carbon rich layer to extend from the substrate to enhance the thermal conductivity between the first and the second regions of the substrate for cooling the silicon substrate.

10. The process of increasing the thermal conductivity in a silicon substrate, comprising the steps of:
providing a substrate of a silicon material having a first and a second region;
applying a first carbon donating doping gas to the first region of the silicon substrate;
directing a first thermal energy beam onto the first region of the silicon substrate in the presence of the first carbon donating doping gas for converting the first region of the silicon substrate into silicon carbide;

directing a second thermal energy beam on the silicon carbide region to simultaneously create a carbon rich region to enhance the thermal conductivity between the first and the second regions of the substrate for cooling the silicon substrate.

11. The process of increasing the thermal conductivity in a silicon substrate, comprising the steps of:
   providing a substrate of a silicon material having a first and a second region;
   applying a first carbon donating doping gas to the first region of the silicon substrate;
   directing a first thermal energy beam onto the first region of the silicon substrate in the presence of the first carbon donating doping gas for converting the first region of the silicon substrate into silicon carbide;
   directing a second thermal energy beam on the silicon carbide region to simultaneously create a carbon rich region and align basal planes generally perpendicular to the substrate to enhance the thermal conductivity between the first and the second regions of the substrate for cooling the silicon substrate.

12. The process of increasing the thermal conductivity in a substrate of a non-wide bandgap material, comprising the steps of:
   providing a substrate of a non-wide bandgap material having a first and a second region;
   applying a first doping gas to the first region of the substrate;
   directing a first thermal energy beam onto the first region of the substrate in the presence of the first doping gas for converting the first region of the substrate into a wide bandgap material;
   applying a second doping gas to the wide bandgap material; and
   directing a second thermal energy beam onto the wide bandgap material for recrystallizing a portion of the wide bandgap material to enhance the thermal conductivity between the first and the second regions of the substrate for cooling the non-wide bandgap material.

13. The process of increasing the thermal conductivity in a substrate of a wide bandgap material, comprising the steps of:
   providing a substrate of a wide bandgap material having a first and a second region;
   applying a doping gas to the wide bandgap material; and
   directing a thermal energy beam onto the wide bandgap material in the presence of the doping gas for converting a portion of the wide bandgap material into a recrystallized wide bandgap thermal conducting material to enhance the thermal conductivity between the first and the second regions of the substrate for cooling the wide bandgap material.

14. The process of increasing the thermal conductivity in a substrate of a non-wide bandgap material, comprising the steps of:
   providing a substrate of a non-wide bandgap material having a first and a second region;
   applying a doping gas to the first region of the substrate;
   directing a thermal energy beam onto the first region of the substrate in the presence of the doping gas for converting the first region of the substrate into a wide bandgap material; and
   continuing the thermal energy beam directed onto the wide bandgap material for recrystallizing a portion of the wide bandgap material to enhance the thermal conductivity between the first and the second regions of the substrate for cooling the non-wide bandgap material.

* * * * *